United States Patent
Lai et al.

(10) Patent No.: US 12,265,332 B2
(45) Date of Patent: Apr. 1, 2025

(54) METHOD OF MANUFACTURING A SEMICONDUCTOR DEVICE

(71) Applicant: TAIWAN SEMICONDUCTOR MANUFACTURING COMPANY, LTD., Hsinchu (TW)

(72) Inventors: Yu-Tse Lai, Zhubei (TW); Minfeng Chen, Hsinchu (TW); Ya Hui Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 633 days.

(21) Appl. No.: 17/491,743

(22) Filed: Oct. 1, 2021

(65) Prior Publication Data
US 2023/0004087 A1    Jan. 5, 2023

Related U.S. Application Data

(60) Provisional application No. 63/212,511, filed on Jun. 18, 2021.

(51) Int. Cl.
  *G03F 7/09*   (2006.01)
  *G03F 7/20*   (2006.01)
  *H01L 21/027* (2006.01)
  *H01L 21/311* (2006.01)

(52) U.S. Cl.
  CPC ............ *G03F 7/094* (2013.01); *G03F 7/2004* (2013.01); *H01L 21/0274* (2013.01); *H01L 21/31144* (2013.01)

(58) Field of Classification Search
  CPC .................................................. H01L 21/0274
  See application file for complete search history.

(56) References Cited

U.S. PATENT DOCUMENTS

| | | | | |
|---|---|---|---|---|
| 4,564,583 A * | 1/1986 | Maeguchi | ........... | H01L 21/0271 430/329 |
| 4,791,046 A * | 12/1988 | Ogura | .................... | G03F 7/0755 430/326 |
| 8,796,666 B1 | 8/2014 | Huang et al. | | |
| 9,093,530 B2 | 7/2015 | Huang et al. | | |
| 9,213,234 B2 | 12/2015 | Chang | | |
| 9,223,220 B2 | 12/2015 | Chang | | |
| 9,256,133 B2 | 2/2016 | Chang | | |
| 9,536,759 B2 | 1/2017 | Yang et al. | | |
| 9,548,303 B2 | 1/2017 | Lee et al. | | |
| 9,857,684 B2 | 1/2018 | Lin et al. | | |
| 9,859,206 B2 | 1/2018 | Yu et al. | | |
| 9,875,892 B2 | 1/2018 | Chang et al. | | |
| 2001/0016300 A1 * | 8/2001 | Iwata | ...................... | G03F 7/091 430/14 |

(Continued)

*Primary Examiner* — William A Harriston
(74) *Attorney, Agent, or Firm* — STUDEBAKER BRACKETT PLLC

(57) ABSTRACT

A method of manufacturing a semiconductor device includes forming a first resist layer over a substrate, and forming a second resist layer over the first resist layer. The second resist layer is patterned to expose a portion of the first resist layer to form a second resist layer pattern. The first resist layer is exposed to extreme ultraviolet (XUV) radiation diffracted by the second resist layer pattern. Portions of the first resist layer exposed to the XUV radiation diffracted by the second resist layer are removed.

20 Claims, 16 Drawing Sheets

(56) References Cited

U.S. PATENT DOCUMENTS

| | | | |
|---|---|---|---|
| 2002/0011573 A1* | 1/2002 | Van Dijsseldonk | G02B 26/0825 |
| | | | 250/492.22 |
| 2002/0021430 A1* | 2/2002 | Koshelev | H05G 2/005 |
| | | | 355/53 |
| 2007/0287105 A1* | 12/2007 | Ito | G03F 7/0045 |
| | | | 430/311 |
| 2010/0028809 A1* | 2/2010 | Vanleenhove | H01L 29/6681 |
| | | | 430/312 |
| 2010/0159392 A1* | 6/2010 | Hatakeyama | G03F 7/0397 |
| | | | 430/326 |
| 2010/0159404 A1* | 6/2010 | Hatakeyama | G03F 7/40 |
| | | | 430/326 |
| 2010/0261121 A1* | 10/2010 | Takahashi | G03F 1/36 |
| | | | 430/325 |
| 2013/0323641 A1* | 12/2013 | Chang | G03F 7/0046 |
| | | | 430/319 |
| 2014/0272724 A1* | 9/2014 | Wang | G03F 7/40 |
| | | | 430/325 |
| 2014/0272726 A1* | 9/2014 | Chang | G03F 7/168 |
| | | | 430/325 |
| 2016/0085003 A1* | 3/2016 | Jaiswal | G03F 7/70958 |
| | | | 250/307 |
| 2021/0134589 A1* | 5/2021 | Weng | G03F 7/0025 |
| 2022/0155672 A1* | 5/2022 | Jaiswal | G03F 7/70958 |

* cited by examiner

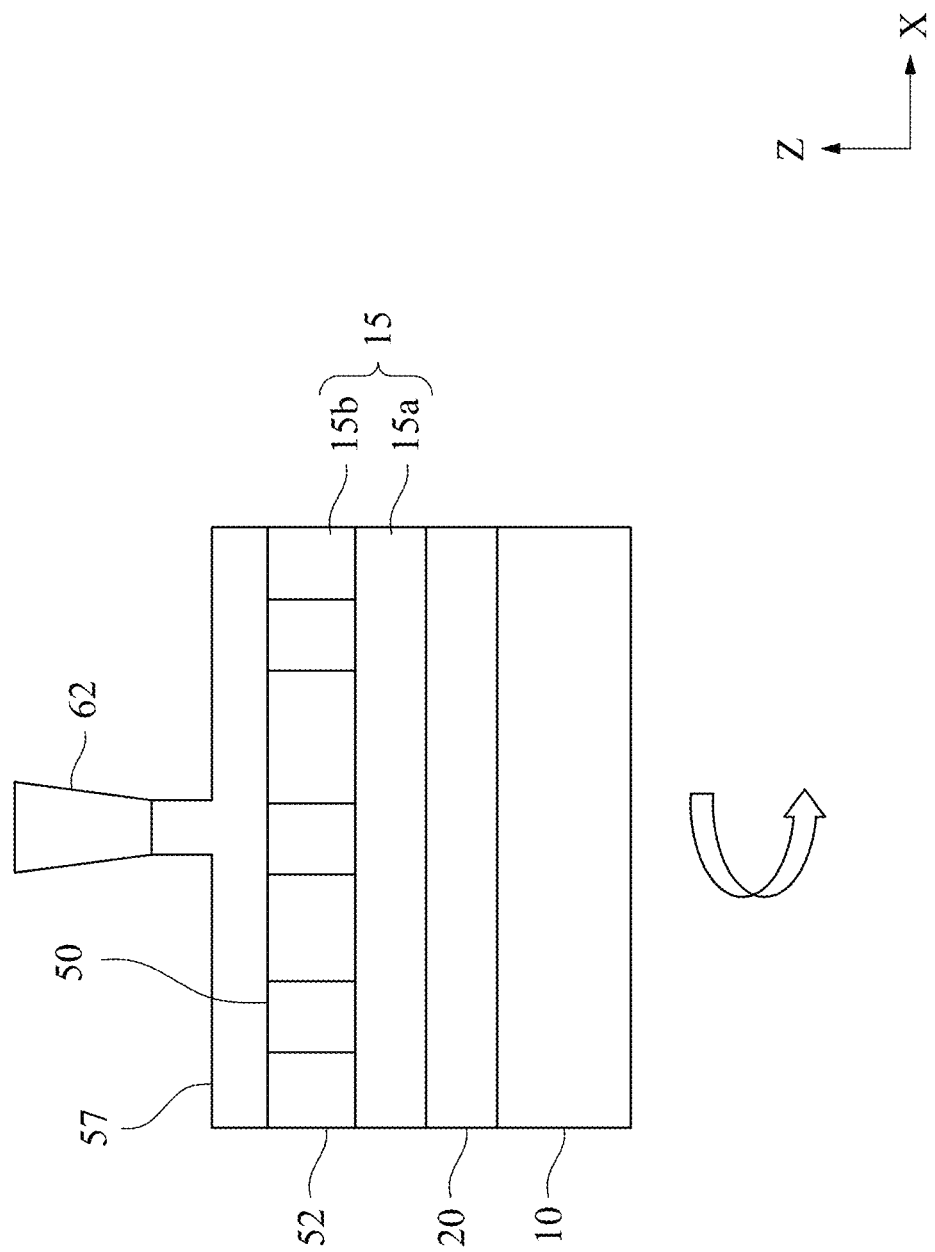

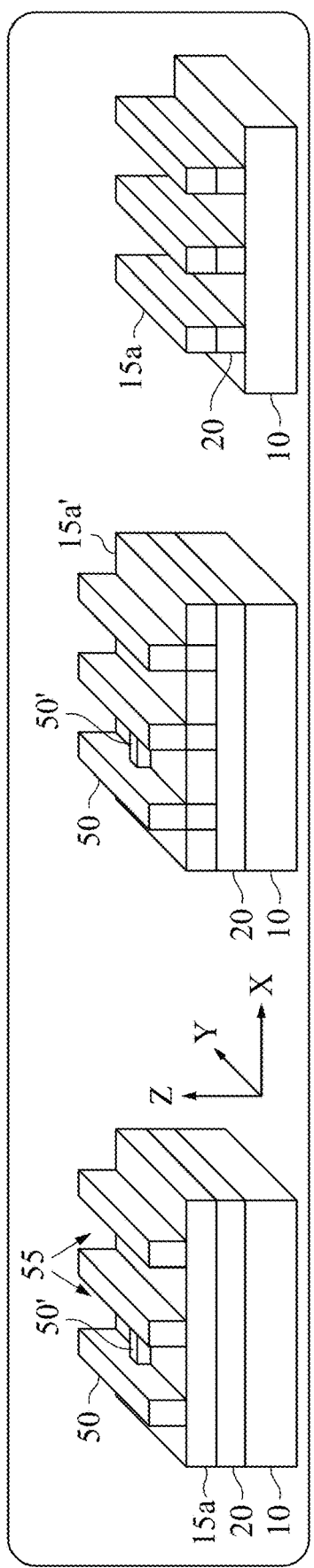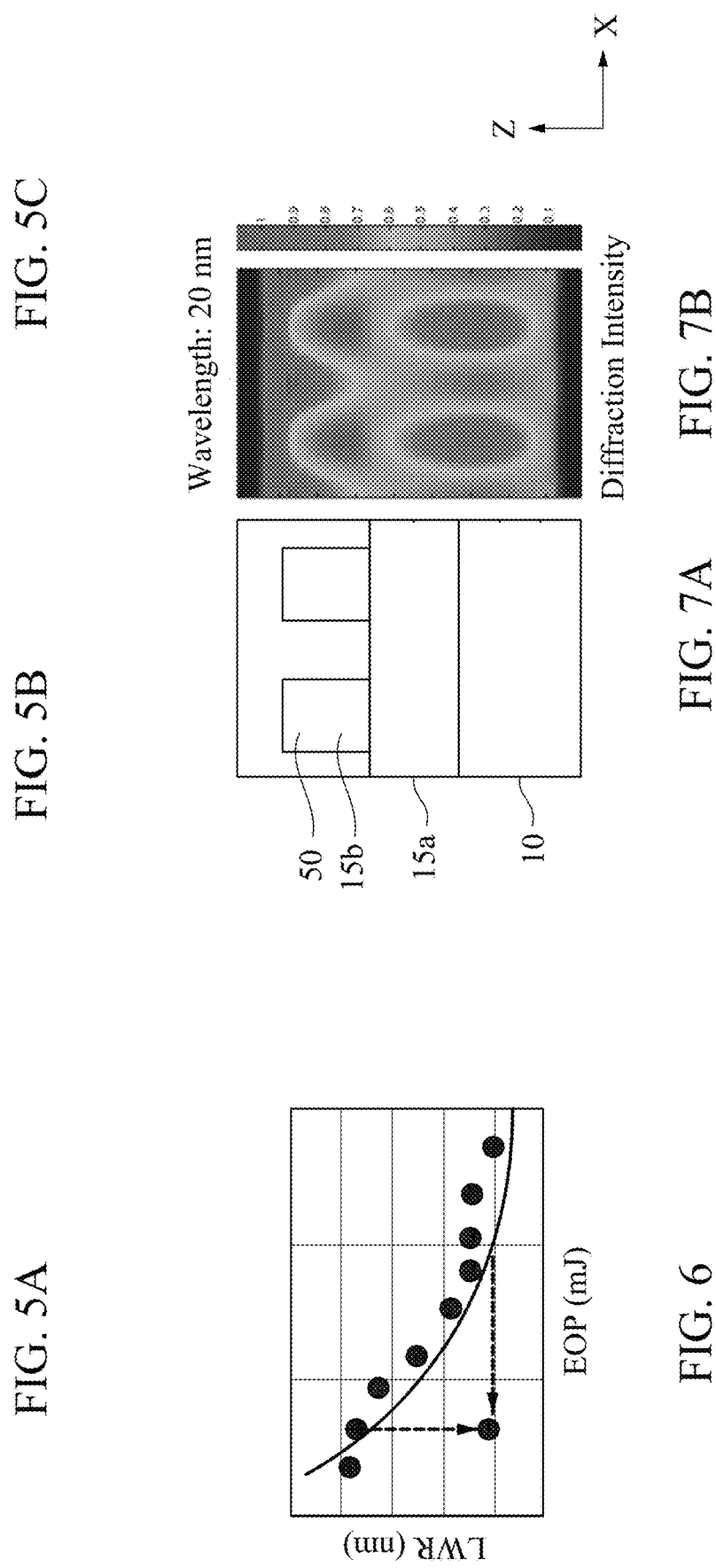
FIG. 5A
FIG. 5B
FIG. 5C
FIG. 6
FIG. 7A
FIG. 7B

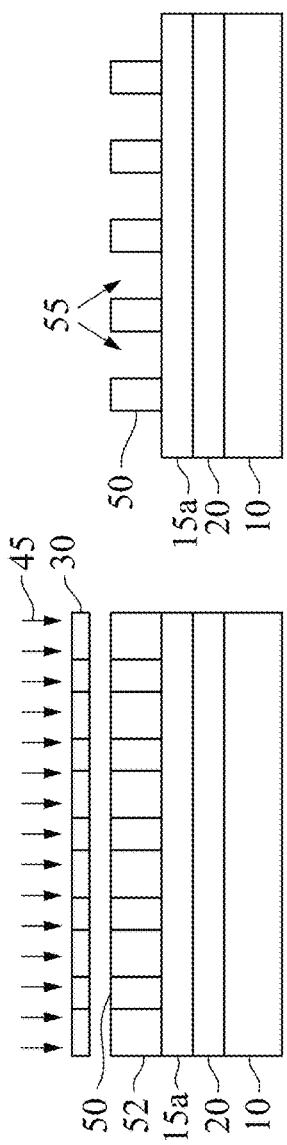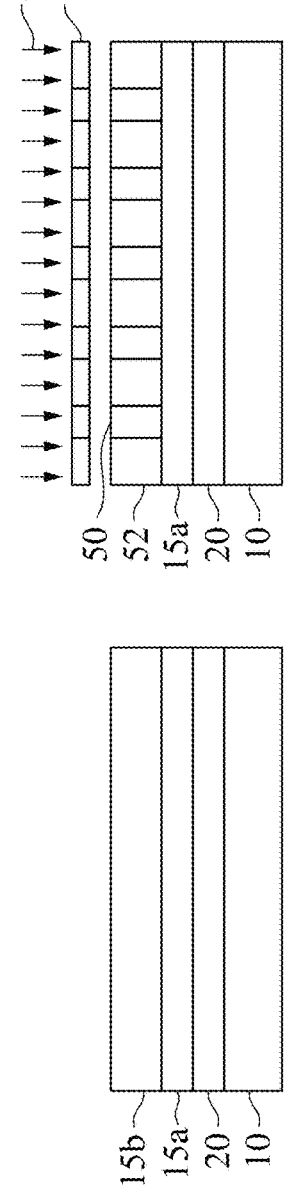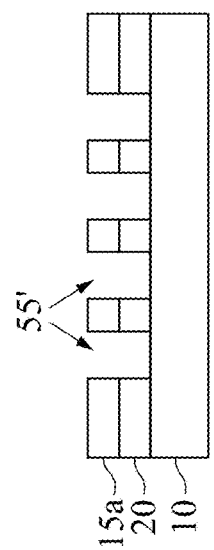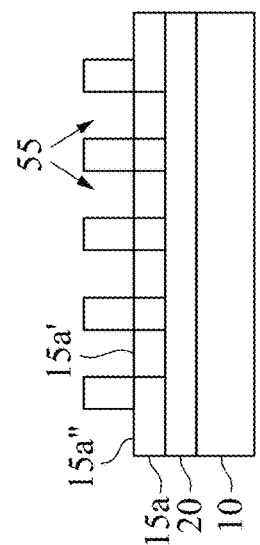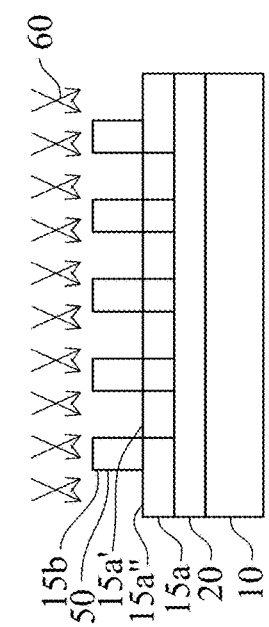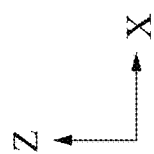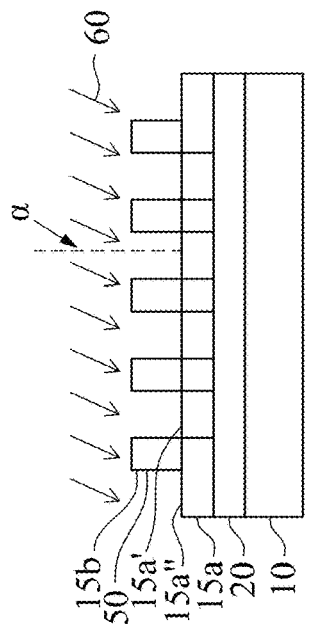

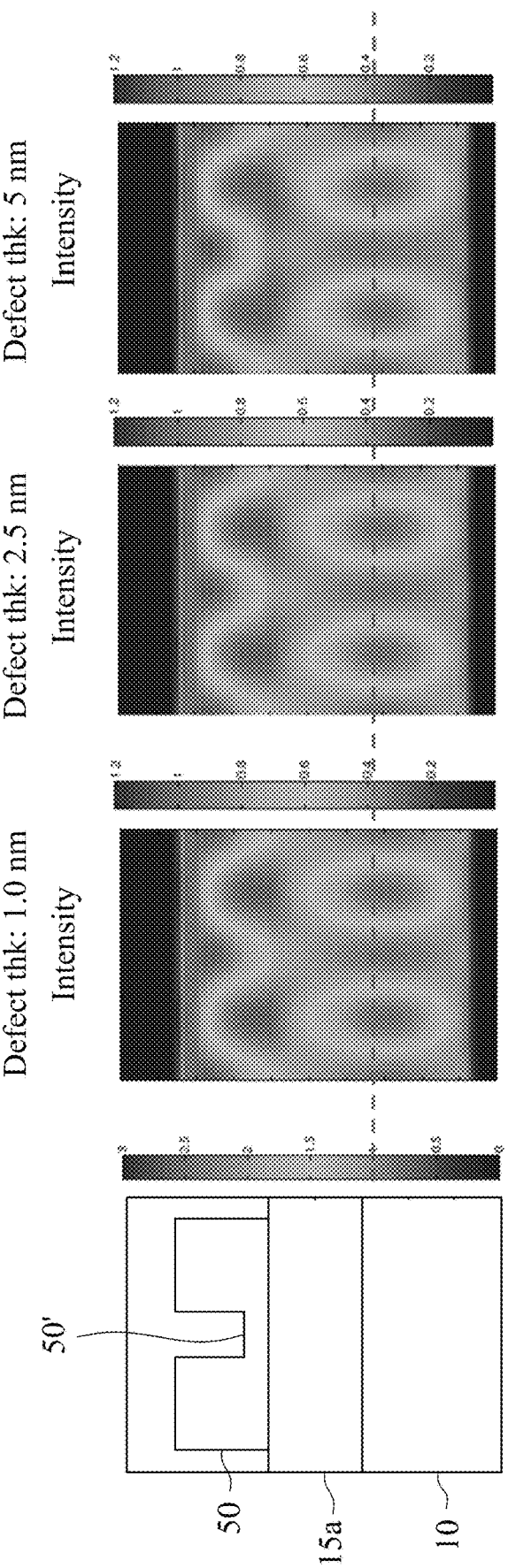

METHOD OF MANUFACTURING A SEMICONDUCTOR DEVICE

RELATED APPLICATION

This application claims priority to U.S. Provisional Patent Application No. 63/212,511, filed Jun. 18, 2021, the entire disclosure of which is incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface of a layer to be patterned and then exposed to an energy that has itself been patterned. Such an exposure modifies the chemical and physical properties of the exposed regions of the photosensitive material. This modification, along with the lack of modification in regions of the photosensitive material that were not exposed, can be exploited to remove one region without removing the other, or vice-verse.

However, as the size of individual devices has decreased, process windows for photolithographic processing has become tighter and tighter. As such, advances in the field of photolithographic processing are necessary to maintain the ability to scale down the devices, and further improvements are needed in order to meet the desired design criteria such that the march towards smaller and smaller components may be maintained.

As the semiconductor industry has progressed into nanometer technology process nodes in pursuit of higher device density, higher performance, and lower costs, there have been challenges in reducing semiconductor feature size.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 4 shows a process stage of a sequential operation according to an embodiment of the disclosure.

FIGS. 5A, 5B, and 5C show sequential process stages according to an embodiment of the disclosure.

FIG. 6 shows a plot of exposure dose versus the line width roughness according to embodiments of the disclosure.

FIG. 7A shows a process stage of a sequential operation according to an embodiment of the disclosure. FIG. 7B shows a diffraction intensity map of an extreme ultraviolet (XUV) flood exposure according to an embodiment of the disclosure.

FIGS. 8A, 8B, 8C, 8D, 8E, 8F, and 8G show sequential process stages according to an embodiment of the disclosure.

FIG. 10A shows a process stage of a sequential operation according to an embodiment of the disclosure. FIGS. 10B, 10C, and 10D show diffraction intensity maps of an XUV flood exposure according to an embodiment of the disclosure.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Resist scum and residue remaining in the patterned areas of the photoresist layer after development cause increased line width roughness and line edge roughness. The scum and residue causes defects in photoresist patterns and results in decreased semiconductor device yield. Embodiments of the present disclosure address these issues, and reduce the amount of scum and residue or substantially eliminate scum and residue after development.

Figure 1:
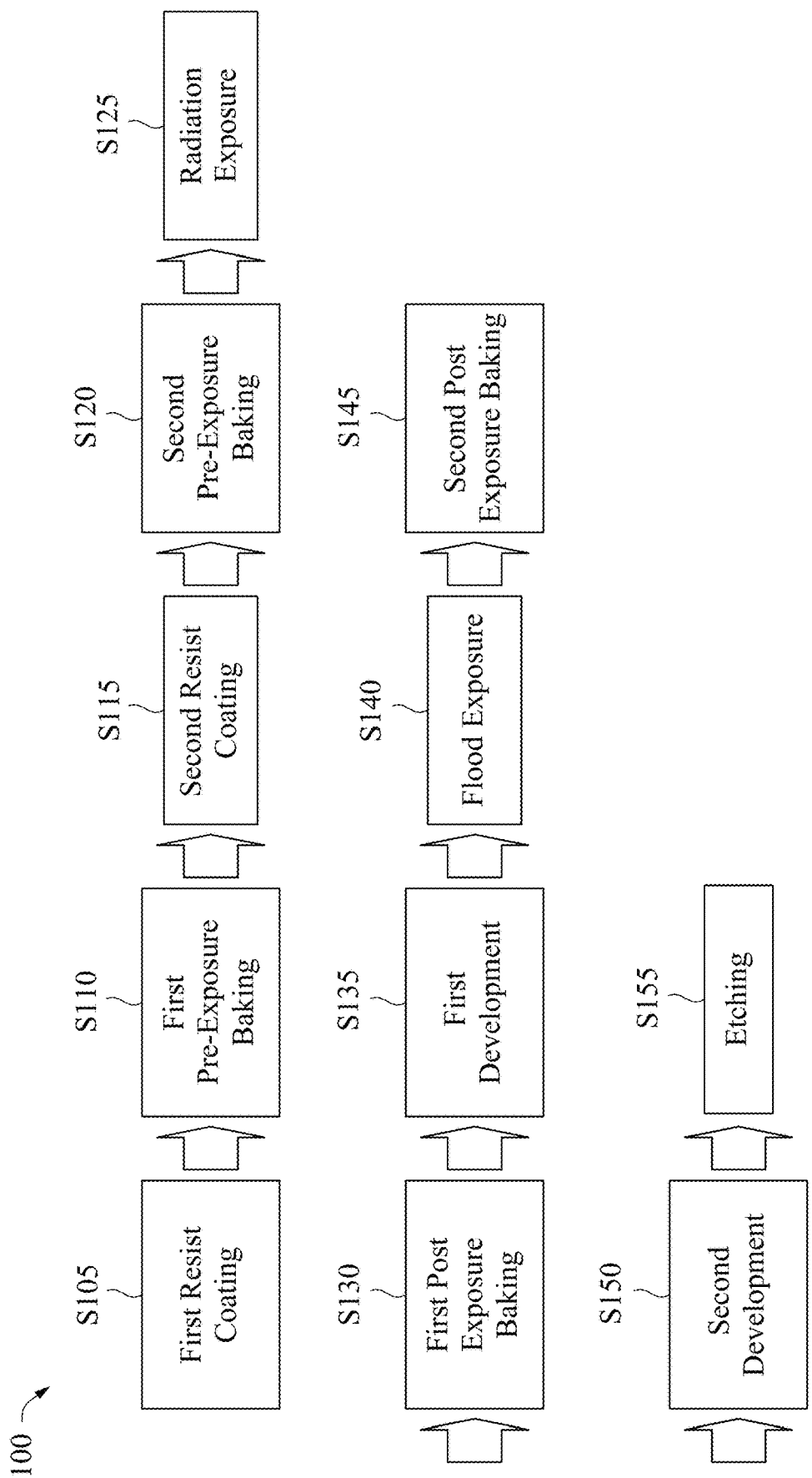
FIG. 1 illustrates a process flow of manufacturing a semiconductor device according to embodiments of the disclosure.
Figure 2:
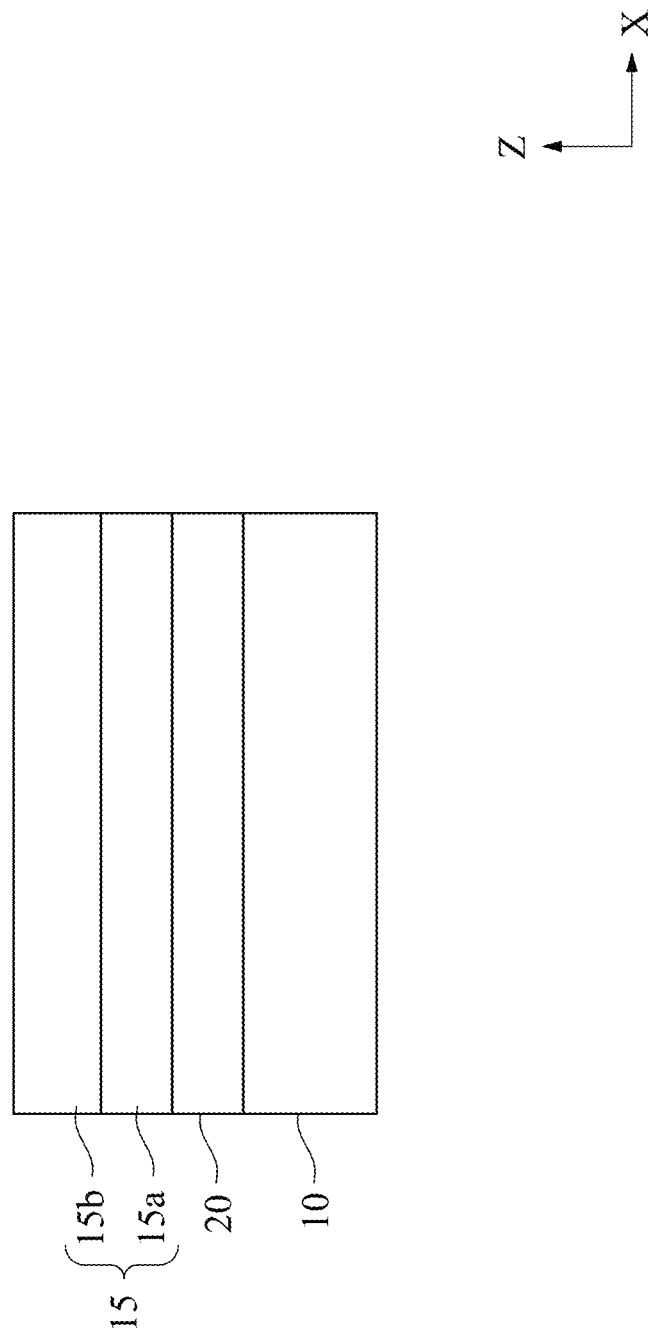
FIG. 2 shows a process stage of a sequential operation according to an embodiment of the disclosure.

FIG. 1 illustrates a process flow 100 of manufacturing a semiconductor device according to embodiments of the disclosure. In some embodiments, a layer to be patterned (or a target layer) 20 is formed over a substrate 10, as shown in FIG. 2. In some embodiments, one or more layers are formed between the substrate 10 and the target layer 20. A first resist layer 15a is formed over the surface of a layer to be patterned (or target layer) 20 or, when the target layer 20 not formed, over the surface of the substrate 10, in the first resist coating operation S105. The first resist layer 15a undergoes a first baking (or pre-exposure baking) operation to evaporate solvents in the resist composition in the first pre-exposure baking operation S110 in some embodiments. Then, as shown in FIG. 2, a second resist layer 15b is formed over the first resist layer 15a, to form a bi-layer resist 15 in the second resist coating operation S115. In some embodiments, the first resist layer 15a includes a chemically-amplified resist (CAR) composition. In some embodiments, the first resist layer 15a includes a polymethylmethacrylate (PMMA) or a polyhydroxystyrene (PHS). In some embodiments, the first resist layer 15a is formed by a spin-coating method. In some embodiments, the second resist layer 15b includes a metal-containing photoresist formed by chemical vapor deposition (CVD) or atomic layer deposition (ALD). In some embodiments, the metal-containing photoresist layer is formed by a spin-coating method.

The photoresist layers 15a, 15b are photosensitive layers that are patterned by exposure to actinic radiation. Typically, the chemical properties of the photoresist regions struck by incident radiation change in a manner that depends on the type of photoresist used. The photoresists are positive tone resists or negative tone resists. A positive tone resist refers to a photoresist material that when exposed to radiation (e.g.—UV light) becomes soluble in a developer, while the region of the photoresist that is non-exposed (or exposed less) is insoluble in the developer. A negative tone resist, on the other hand, refers to a photoresist material that when exposed to radiation becomes insoluble in the developer, while the region of the photoresist that is non-exposed (or exposed less) is soluble in the developer. The region of a negative tone resist that becomes insoluble upon exposure to radiation may become insoluble due to a cross-linking reaction caused by the exposure to radiation. In some embodiments, the resist is a negative tone developed (NTD) resist. In an NTD resist, instead of the portion of the resist exposed to actinic radiation crosslinking, a developer solvent is selected that preferentially dissolves the unexposed portion of the resist to form the patterned resist.

Then, the resist layers 15a, 15b undergo a second baking (or pre-exposure baking) operation S120 to evaporate solvents in the resist composition in some embodiments. The resist layers are baked at a temperature and time sufficient to cure and dry the resist layers. In some embodiments, the resist layers are heated at a temperature of about 40° C. and 120° C. for about 10 seconds to about 10 minutes. In some embodiments, each resist layer undergoes pre-exposure baking after each resist layer is formed. In other embodiments, the first resist layer 15a and the second resist layer 15b are formed and then both layers are subjected to the pre-exposure baking operation S120.

The second resist layer 15b is selectively exposed to actinic radiation 45 (see FIGS. 3A and 3B) in the radiation exposure operation S125. In some embodiments, the second resist layer 15b is selectively exposed to ultraviolet radiation. In some embodiments, the ultraviolet radiation is deep ultraviolet (DUV) radiation. In some embodiments, the ultraviolet radiation is extreme ultraviolet (EUV or XUV) radiation. EUV and XUV are used interchangeably in this disclosure. In some embodiments, the radiation is an electron beam.

Figure 3A:
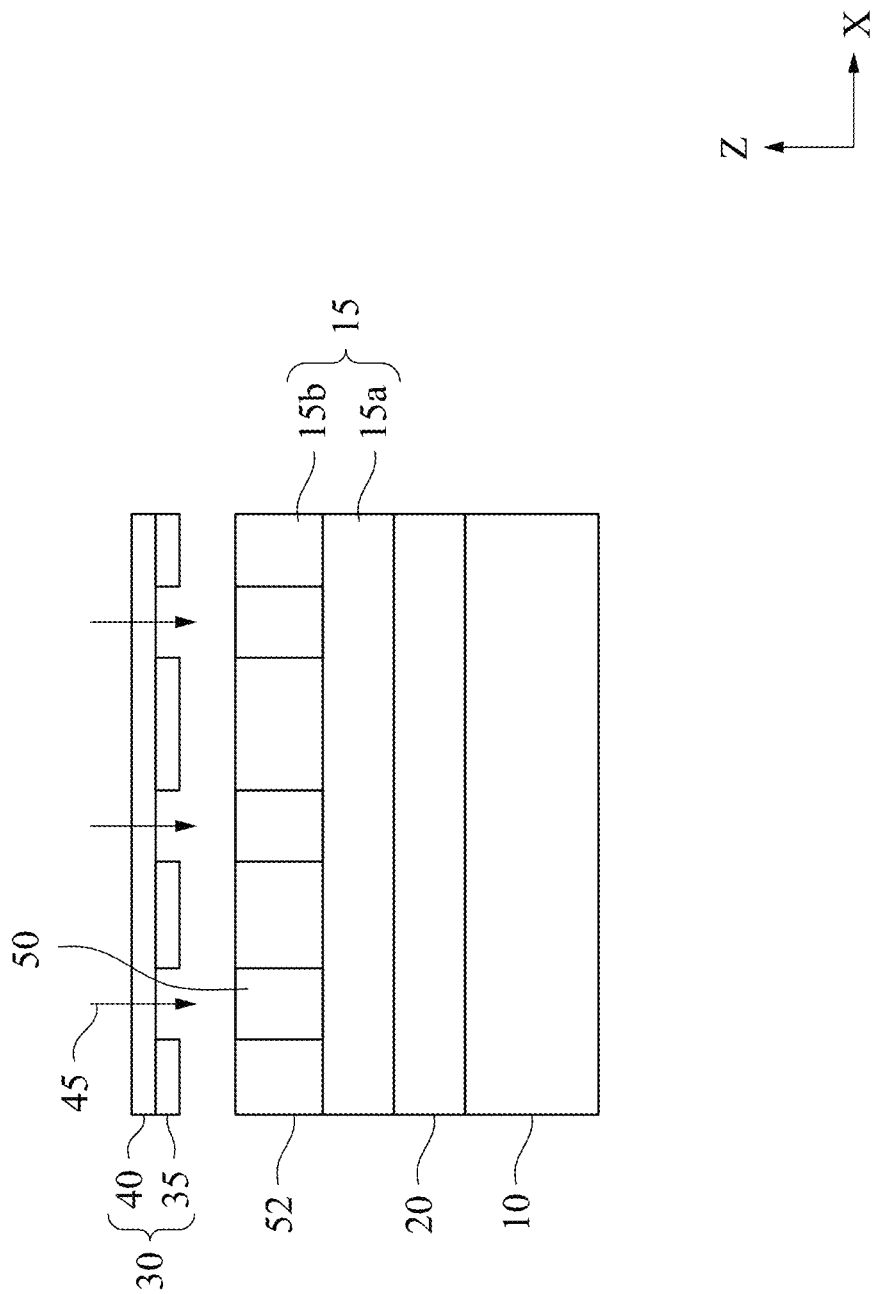
FIGS. 3A and 3B show a process stage of a sequential operation according to an embodiment of the disclosure.

As shown in FIG. 3A, the exposure radiation 45 passes through a photomask 30 before irradiating the resist layer 15b in some embodiments. In some embodiments, the photomask has a pattern to be replicated in the resist layer 15b. The pattern is formed by an opaque pattern 35 on photomask substrate 40, in some embodiments. The opaque pattern 35 may be formed by a material opaque to ultraviolet radiation, such as chromium, while the photomask substrate 40 is formed of a material that is transparent to ultraviolet radiation, such as fused quartz.

Figure 3B:
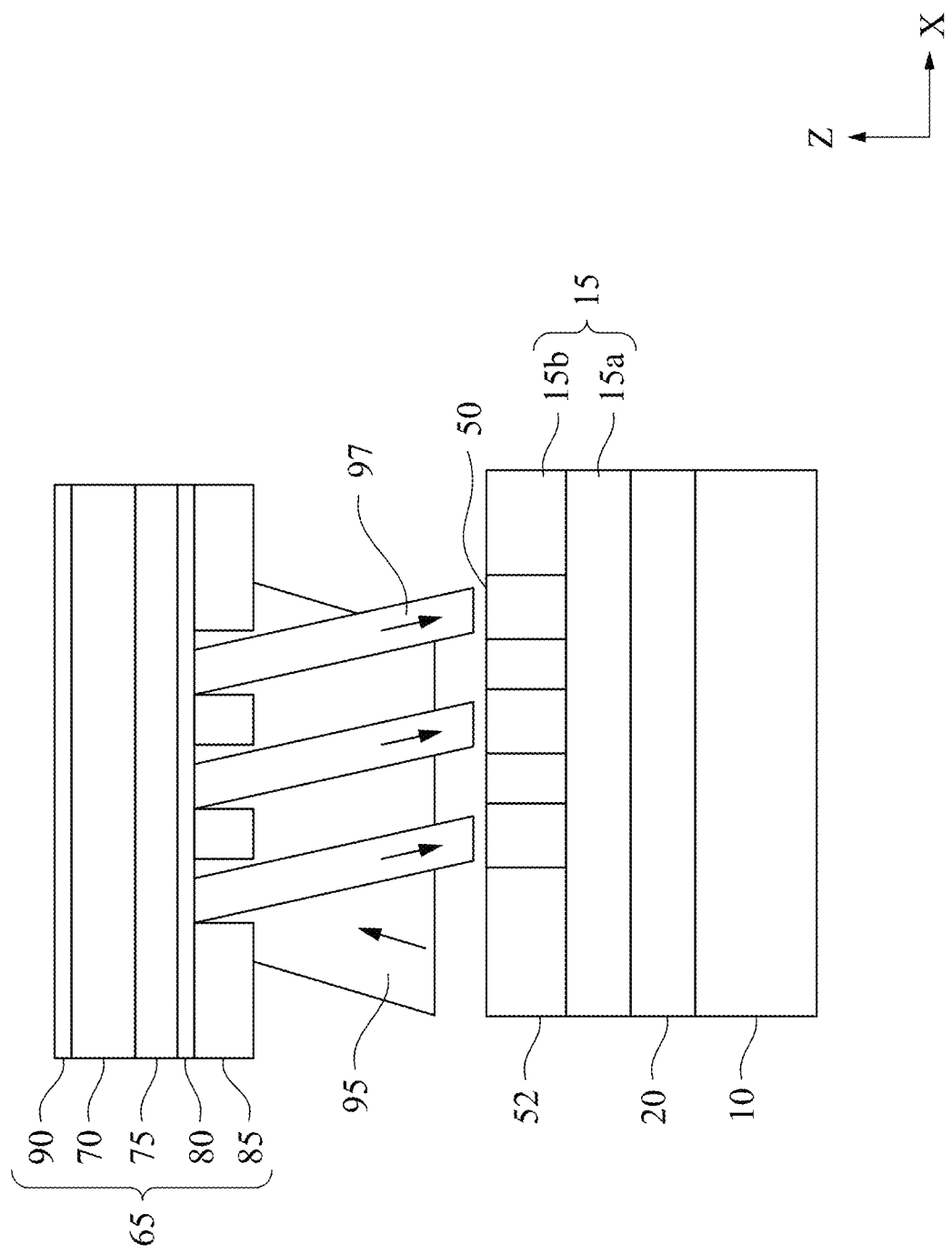

In some embodiments, the selective exposure of the photoresist layer 15a to form exposed regions 50 and unexposed regions 52 is performed using extreme ultraviolet lithography. In some embodiments, a reflective photomask 65 is used to form the patterned exposure light in extreme ultraviolet lithography in some embodiments, as shown in FIG. 3B. The reflective photomask 65 includes a low thermal expansion glass substrate 70, on which a reflective multilayer 75 of Si and Mo is formed. A capping layer 80 and absorber layer 85 are formed on the reflective multilayer 75. A rear conductive layer 90 is formed on the backside of the low thermal expansion glass substrate 70. Extreme ultraviolet radiation 95 is directed towards the reflective photomask 65 at an incident angle of about 6°. A portion 97 of the extreme ultraviolet radiation is reflected by the Si/Mo multilayer 75 towards the photoresist-coated substrate 10, while the portion of the extreme ultraviolet radiation incident upon the absorber layer 85 is absorbed by the photomask. In some embodiments, additional optics, including mirrors, are between the reflective photomask 65 and the photoresist-coated substrate.

In some embodiments, the resist layer 15b is a photoresist layer. The region of the photoresist layer 15b exposed to radiation 50 undergoes a chemical reaction thereby changing its solubility in a subsequently applied developer relative to the region of the photoresist layer not exposed to radiation 52. In some embodiments, the portion of the photoresist layer exposed to radiation 50 undergoes a crosslinking reaction.

The amount of electromagnetic radiation, to which the photoresist layer 15b is exposed, can be characterized by a fluence or dose, which is obtained by the integrated radiative flux over the exposure time. Suitable radiation fluences range from about 1 mJ/cm$^2$ to about 150 mJ/cm$^2$ in some embodiments, from about 2 mJ/cm$^2$ to about 100 mJ/cm$^2$ in other embodiments, and from about 3 mJ/cm$^2$ to about 50 mJ/cm$^2$ in other embodiments. A person of ordinary skill in the art will recognize that additional ranges of radiation fluences within the explicit ranges above are contemplated and are within the present disclosure.

In some embodiments, the selective or patternwise exposure is performed by a scanning electron beam. With electron beam lithography, the electron beam induces secondary electrons, which modify the irradiated material. High resolution is achievable using electron beam lithography and the metal-containing resists disclosed herein. Electron beams can be characterized by the energy of the beam, and suitable energies range from about 5 V to about 200 kV (kilovolt) in some embodiments, and from about 7.5 V to about 100 kV in other embodiments. Proximity-corrected beam doses at 30 kV range from about 0.1 µC/cm$^2$ to about 5 µC/cm$^2$ in some embodiments, from about 0.5 µC/cm$^2$ to about 1 µC/cm$^2$ in other embodiments, and in other embodiments from about 1 µC/cm$^2$ to about 100 µC/cm$^2$. A person of ordinary skill in the art can compute corresponding doses at other beam energies based on the teachings herein and will recognize that additional ranges of electron beam properties within the explicit ranges above are contemplated and are within the present disclosure.

Next, the resist layers 15a, 15b undergo a first post exposure bake (PEB) in the first post exposure baking operation S130. In some embodiments, the resist layers 15a, 15b are heated at a temperature of about 50° C. to about 250° C. for about 20 seconds to about 300 seconds. In some embodiments, the post-exposure baking is performed at a temperature ranging from about 100° C. to about 230° C., and at a temperature ranging from about 150° C. to about 200° C. in other embodiments. In some embodiments, the post-exposure baking causes the reaction product of a first compound or first precursor and a second compound or second precursor in the resist layer 15b that was exposed to actinic energy to further crosslink.

The selectively exposed resist layer 15b is subsequently developed by applying a developer to the selectively exposed resist layer during the first development operation S135. As shown in FIG. 4, a developer 57 is supplied from a dispenser 62 to the resist layer 15b. In some embodiments, the unexposed portion of the resist layer 52 is removed by the developer 57 forming a pattern of recesses 55 in the resist layer 15b to expose the first resist layer 15a (see FIG. 5A). In some embodiments, dry development or resist etching is also used for patterning.

In some embodiments, bottom scum or residue 50' remains in the patterned second photoresist layer 50 after the first development operation S135, as shown in FIG. 5A. In some embodiments, a flood exposure is subsequently performed in flood exposure operation S140. The exposed areas 15a' of the first photoresist layer 15a are shown in FIG. 5B. In some embodiments, the flood exposure is performed using XUV radiation. Flood exposure and flood exposing means the XUV radiation is not patterned or selectively scanned prior to impinging on the patterned second photoresist layer 50. In some embodiments, the XUV radiation is not passed through or reflected off a photomask prior to impinging on the patterned second photoresist layer 50. In some embodiments, both the patterned second photoresist layer 50 and portions of the first photoresist layer 15a not covered by the patterned second photoresist layer are unmasked to XUV radiation during the flood exposure. The patterned second photoresist layer 50, however, masks the underlying first photoresist layer 15a during the flood exposure operation S140 in some embodiments. In some embodiments, the XUV radiation has a wavelength ranging from about 0.1 nm to about 100 nm. In other embodiments, the XUV radiation has a wavelength ranging from about 10 nm to about 30 nm. The EUV/XUV radiation source is a laser excited tin plasma in some embodiments. The radiation from the laser excited tin plasma is filtered in some embodiments to provide a desired exposure wavelength (e.g., 13.5 nm or 50 nm).

In some embodiments, after the flood exposure, the first resist layer 15a, 15b undergoes a second post exposure baking in second post exposure baking operation S145. The time and temperature for the second post exposure baking may be in the same ranges as those disclosed herein for the first post exposure baking operation S130.

In some embodiments, when the second resist layer 15b is a metal or metal oxide containing resist and the resist patterns have a periodic structure (e.g., line-and-space patterns), the resist patterns 50 formed by the metal or metal oxide resist function like a diffraction grating and diffract the XUV radiation. The diffracted XUV radiation is constructively interfered and the resulting constructive interference XUV exposes the portion of the resist layer 15a underneath the bottom scum 50', as shown in FIG. 5B. During a subsequent second development operation S150 of the first resist layer 15a, the bottom scum is removed along with the exposed areas 15a' of the first resist layer 15a. Thus, embodiments of the present disclosure reduce bottom scum defects, such as bridging and short circuits.

In some embodiments, the pitch of the second photoresist pattern 50 are of the same order of dimension as the wavelength of the flood exposure radiation to cause diffraction of the flood exposure radiation. In some embodiments, the pitch of the second photoresist pattern 50 is within about ±40 nm of the flood exposure radiation wavelength.

Then, in some embodiments, the target layer 20 is subsequently etched in etching operation S155 exposing the substrate 10, as shown in FIG. 5C. In some embodiments, the patterned second photoresist layer 50 is removed during the etching operation S155. In other embodiments, the patterned second photoresist 50 is removed using a suitable resist stripping solvent after the etching operation S155.

In some embodiments, line width roughness (LWR) is improved and the exposure dose (EOP) is reduced, as shown in FIG. 6, compared to photolithography operations using a single exposure to a photo resist layer without a flood exposure, as shown by the dashed lines pointing to the lower LWR and EOP data point. In some embodiments, chemical diffusion in the chemically amplified resist (CAR) second resist layer further improves the LWR. In some embodiments, the post exposure baking (PEB) operation S145 after the flood exposure operation S140 contributes to the diffusion of a photoacid generated in the first resist layer 15a.

Pseudospectral time-domain (PSTD) simulation is used to verify the results of the disclosed methods and structures. In some embodiments, in the PSTD simulation, the second resist layer 15b (the pattern 50) is a tin oxide-based photoresist and the first resist layer is a polymethylmethacrylate (PMMA) based resist, and the structure is shown in FIG. 7A. As shown in FIG. 7B, in a PTSD simulation using a 20 nm flood exposure wavelength, the diffracted waves have a high intensity below the tin oxide-based photoresist pattern features. Thus, the areas of the first resist layer to be patterned can be tuned by selection of the exposure wavelength, and metal oxide pattern pitch and aspect ratio in some embodiments.

Another embodiment is illustrated in FIGS. 8A-8E. As shown in FIG. 8A, the target layer 20 is a hardmask layer formed over a substrate 10. In some embodiments, the hardmask layer 20 is made of an oxide or nitride, such as a silicon oxide or a silicon nitride. In other embodiments, the hardmask layer 20 is a metal or semiconductor layer. A first photoresist layer 15a is formed over the hardmask layer 20, and a second photoresist layer 15b is formed over the first photoresist layer 15a. The first photoresist layer 15a is made of a CAR and the second photoresist layer 15*b* is made of a metal-oxide resist material in some embodiments.

The second photoresist layer 15*b* is subsequently selectively exposed to actinic radiation 45, such as DUV or XUV, as shown in FIG. 8B to produce exposed areas 50 and unexposed areas 52 of the second photoresist layer. Then, the second photoresist layer is developed, to form a pattern 55, as shown in FIG. 8C. The patterned second photoresist layer 50 and the first photoresist layer 15*a* is then flood exposed to XUV radiation 60, as shown in FIG. 8D.

In some embodiments, the pattern features of the second photoresist layer function as a diffraction grating during the flood exposure, thereby creating constructive and destructive interference of the XUV radiation 60. In some embodiments, constructive interference between adjacent patterned second photoresist layer features 50 increases the intensity of the impinging radiation such that portions 15*a*' of the first photoresist layer are sufficiently exposed to the XUV radiation so as to be removable during a subsequent development operation. On the other hand, edge portions 15*a*" of the first photoresist layer are not exposed to the constructively interfered XUV radiation, are not sufficiently exposed, and are not removed during a subsequent development operation.

In some embodiments, there is a patterning tone reversal of the first photoresist layer 15*a*. For example in some embodiments, the second photoresist layer 15*b* functions as a negative tone resist, and the first photoresist layer 15*a* functions as a positive tone resist.

In some embodiments, directional exposure techniques are used during the flood exposure operation S140. In directional exposure, the incident radiation is directed at an acute angle α relative to a normal line in the z direction intersecting the surface along the x direction of the first photoresist layer, as shown in FIG. 8E. In some embodiments, the acute angle ranges from greater than 0° to about 80°. In some embodiments, the directional exposure contributes to exposing the portion of the first photoresist layer 15*a* beneath bottom scum defects.

In some embodiments, photoacids or photobases generated during the XUV flood exposure diffuse through the exposed portions of the first photoresist layer 15*a*', as shown in FIG. 8F. In some embodiments, a PEB is utilized to facilitate the chemical diffusion. Then the first photoresist layer 15*a* is developed, and the hardmask layer 20 is etched, thereby extending the second photoresist layer pattern 55 into hardmask layer 20 to create a hardmask pattern 55' exposing the substrate 10, as shown in FIG. 8G. In some embodiments, the patterned metal oxide photoresist layer 50 is removed during the hardmask etching operation S155, in other embodiments, the patterned metal oxide photoresist layer 50 is removed by a separate etching or stripping operation. In some embodiments, the patterned first photoresist layer 15*a* is subsequently removed by a suitable etching or stripping operation.

Figures 9A, 9B, 9C, 9D:
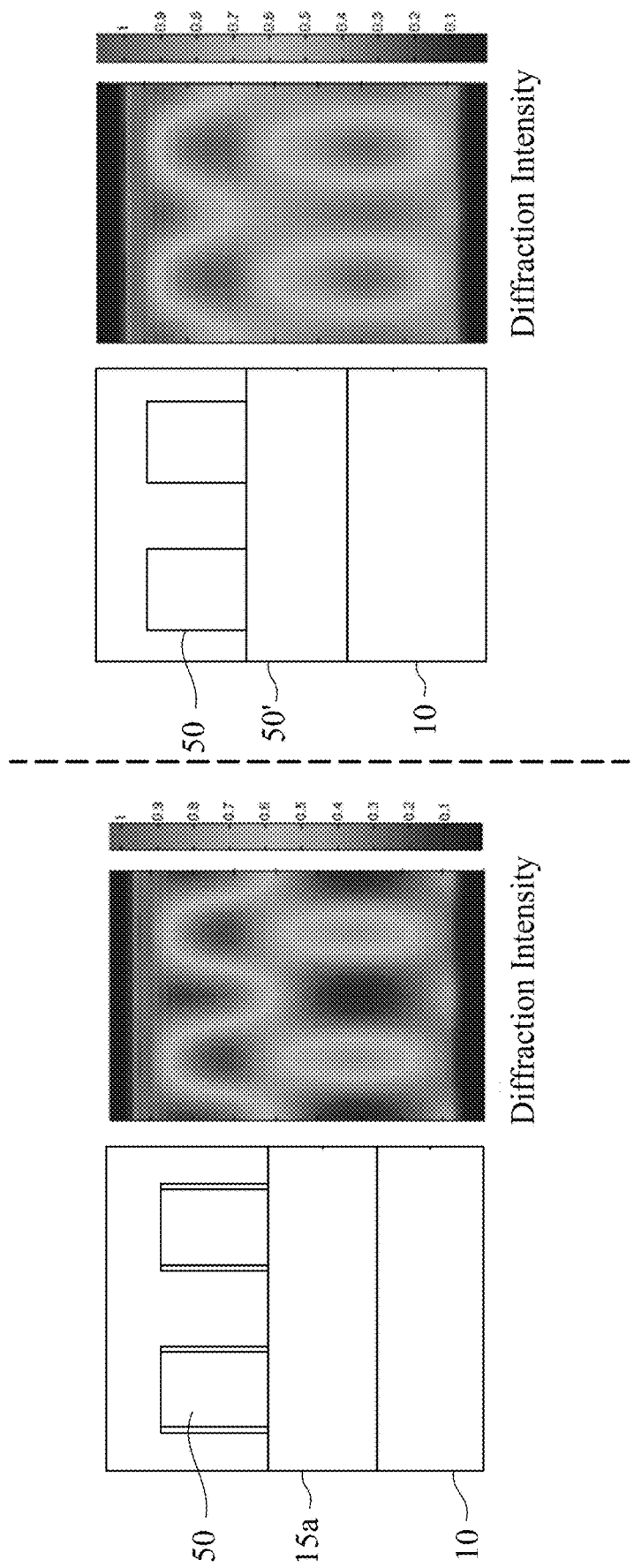
FIG. 9A shows a process stage of a sequential operation according to an embodiment of the disclosure.
FIG. 9B shows a diffraction intensity map of an XUV flood exposure according to an embodiment of the disclosure.
FIG. 9C shows a process stage of a sequential operation according to another embodiment of the disclosure.
FIG. 9D shows a diffraction intensity map of an XUV flood exposure according to another embodiment of the disclosure.

PSTD simulation of XUV diffraction according to embodiments of the disclosure are shown in FIGS. 9A and 9B, and 10A and 10B. FIGS. 9A and 10A show film stacks according to some embodiments. The film stacks include a PMMA-containing first photoresist layer 15*a* disposed over a substrate 10, and a patterned metal oxide based second photoresist layer 50 disposed over the first photoresist layer 15*a* in some embodiments. The pattern pitch is around the wavelength of the flood exposure radiation to cause diffraction in some embodiments. In the embodiment of FIG. 9A, the patterned photoresist layer 50 has a greater feature pitch than FIG. 10A. In FIG. 9A the photoresist pattern 50 has a pitch of about 36 nm, whereas in FIG. 10A the photoresist pattern has a pitch of about 30 nm. FIGS. 9B and 10B show the PTSD of 20 nm wavelength flood exposures. As shown in FIGS. 9B and 10B, in some embodiments, portions of the first photoresist layer beneath the metal oxide based photoresist pattern features are exposed more to the XUV radiation than the other portions, because of constructive interference caused by the photoresist pattern features. Thus, it is possible to selectively expose the portions of the first resist layer 15*a* below the patterns 50 of the second resist layer 15*b*. If the first resist layer 15*a* is negative tone resist, the exposed portion become insoluble to the developer when the exposed dose is above the threshold dose, and if the first resist layer 15*a* is a positive tone the exposed portion becomes soluble, when the exposed dose is above the threshold dose. FIG. 9C shows a process stage of a sequential operation according to another embodiment of the disclosure. FIG. 9D shows a diffraction intensity map of an XUV flood exposure according to another embodiment of the disclosure.

FIGS. 10A, 10B, 10C, and 10D illustrate PTSD simulations of the effects of bottom scum defects at different thicknesses. FIG. 10A illustrates a film stack with a bottom scum defect 50' between the second resist pattern features 50. As shown in FIGS. 10B, 10C, and 10D, the PTSD simulations show that bottom scum defects up to 5 nm in thickness do not significantly impact the diffraction intensity distribution in the first resist layer. In some embodiments, up to 10 nm thick bottom scum defects do not negatively impact the subsequent patterning of the first resist layer.

Figure 11A:
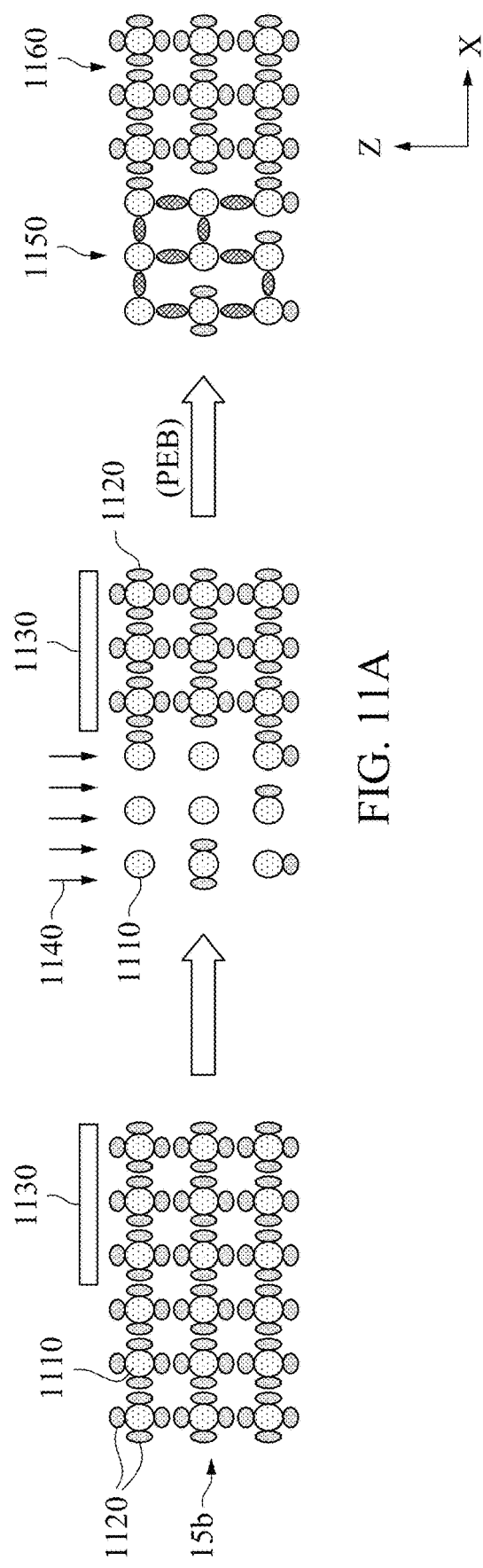
FIGS. 11A and 11B show the photolithographic reactions of the second and first photoresist layers, respectively, according to embodiments of the disclosure.

The reaction mechanism for the exposure of the metal oxide based second resist layer 15*b* is schematically shown in FIG. 11A for some embodiments. The metal oxide based resists include metal oxide nanoparticles 1110 complexed by ligands 1120. A portion of the second resist layer is masked by a mask 1130, as schematically shown. The unmasked portion of the second resist layer is exposed to actinic radiation 1140, such as EUV radiation. Absorption of the EUV radiation causes the ligands 1120 to detach from the metal oxide nanoparticles 1110. Then, during a post exposure bake (PEB) an oxo-network condensation occurs cross-linking the metal oxide nanoparticles creating insoluble portions 1150 of the second resist layer and insoluble portions 1160 of the second resist layer.

Figure 11B:
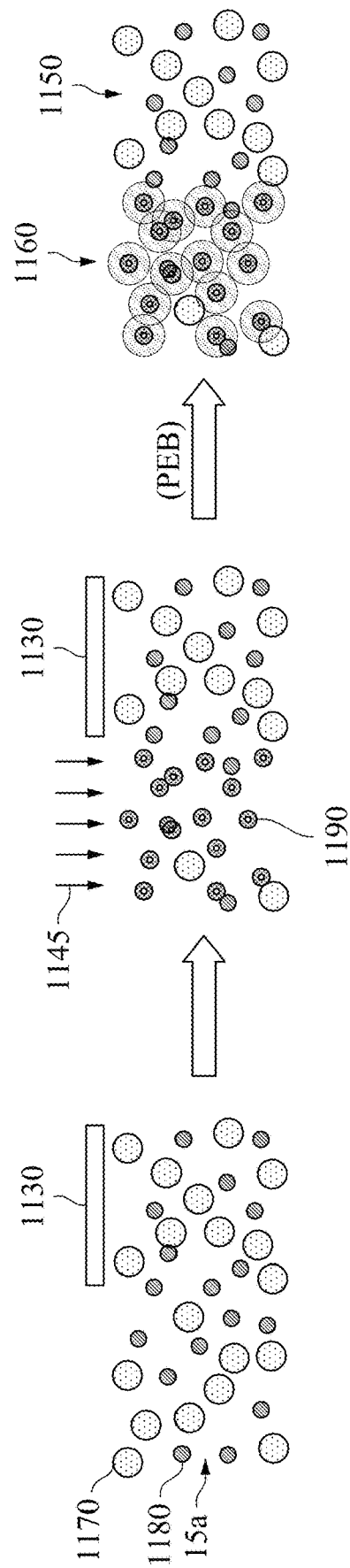

The reaction mechanism for the exposure of the chemically amplified resist (CAR) first resist layer 15*a* is schematically shown in FIG. 11B for some embodiments. The CAR resists include a polymer, such as PMMA (not shown); a photoacid generator (PAG) 1170; and a quencher 1180 in some embodiments. A portion of the first resist layer is masked by a mask 1130, as schematically shown. The unmasked portion of the second resist layer is exposed to actinic radiation 1145, such as EUV radiation. Absorption of the EUV radiation causes the PAG 1170 to generate acids 1190. Then, during a post exposure bake (PEB) acid diffusion and neutralization deblocking occurs creating insoluble portions 1160 of the first resist layer and soluble portions 1150 of the first resist layer.

In some embodiments, the metal oxide resist layer 15*b* has about three times the EUV absorption of the CAR resist layer 15*a*.

Figures 12A, 12B, 12C, 12D:
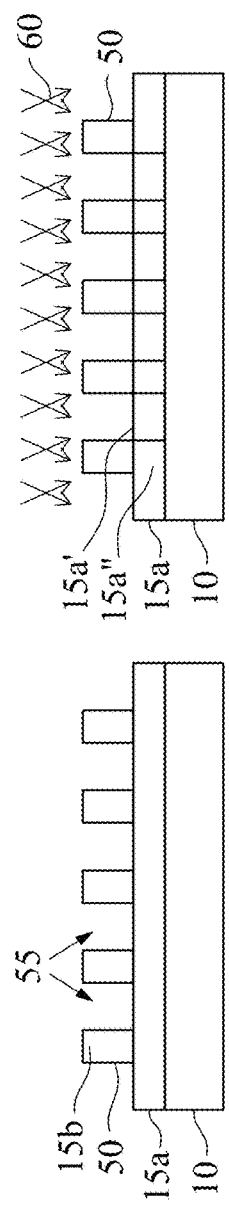
FIGS. 12A, 12B, 12C, and 12D show sequential process stages according to an embodiment of the disclosure.

Tone reversal of the photoresist is provided by embodiments of the disclosure, as shown in FIGS. 12A-12D. FIG. 12A corresponds to the structures of FIGS. 5A and 8C. The second photoresist layer 15*b* is patterned according to techniques disclosed herein. The patterned second photoresist layer 15*b* functions as a diffraction pattern mask of the first photoresist layer 15a during the XUV flood exposure 60, as shown in FIG. 12B. Because of the diffraction caused by adjacent pattern features 50 of the second photoresist layer, constructive and destructive interference occur, causing high intensity regions under the pattern features 50. The exposed portions 15a' of the first photoresist layer do not receive sufficient XUV radiation during the flood exposure operation S140 to become soluble in the developer. On the other hand, the portions 15a''' of the first photoresist layer under the pattern features 50 of the first photoresist layer receive sufficient XUV radiation during the flood exposure operation S140 to become soluble in the developer. In some embodiments, directional exposure techniques are used during the flood exposure operation. In some embodiments, the XUV radiation is directed at an acute angle α relative to a normal line intersecting the surface of the first photoresist layer, as shown in FIG. 12C. In some embodiments, the acute angle ranges from greater than 0° to about 80° in some embodiments, the directional exposure contributes to exposing the portion of the first photoresist layer 15a beneath bottom scum defects.

After stripping the remaining first photoresist layer 50 and developing the first photoresist layer 15a, tone reversal occurs. As shown in FIG. 12D, the resulting pattern 55" in the first photoresist layer is the inverse of the pattern 55 that was formed in the second photoresist layer.

In some embodiments, the thickness of the first resist layer 15a ranges from about 10 nm to about 50 nm. In other embodiments, the thickness of the first resist layer 15a ranges from about 15 nm to about 35 nm. In some embodiments, the thickness of the second resist layer 15b ranges from about 10 nm to about 50 nm. In other embodiments, the thickness of the second resist layer 15b ranges from about 20 nm to about 40 nm. In some embodiments, the pitch of the second resist layer pattern 55 ranges from about 10 nm to about 50 nm. In other embodiments, the pitch of the second resist layer pattern 55 ranges from about 14 nm to about 48 nm. In other embodiments, the pitch of the second resist layer pattern 55 ranges from about 24 nm to about 40 nm. In some embodiments, the wavelength of the flood exposure is about 0.5 times to 2 times the pitch of the second resist layer pattern 55.

The photoresist layer thickness can be evaluated using non-contact methods of x-ray reflectivity and/or ellipsometry based on the optical properties of the photoresist layers. In some embodiments, each photoresist layer thickness is relatively uniform to facilitate processing. In some embodiments, the variation in thickness of the deposited photoresist layer varies by no more than ±25% from the average thickness, in other embodiments each photoresist layer thickness varies by no more than ±10% from the average photoresist layer thickness. In some embodiments, such as high uniformity depositions on larger substrates, the evaluation of the photoresist layer uniformity may be evaluated with a 1 centimeter edge exclusion, i.e., the layer uniformity is not evaluated for portions of the coating within 1 centimeter of the edge. A person of ordinary skill in the art will recognize that additional ranges within the explicit ranges above are contemplated and are within the present disclosure.

In some embodiments, the substrate 10 includes a single crystalline semiconductor layer on at least it surface portion. The substrate 10 may include a single crystalline semiconductor material such as, but not limited to, Si, Ge, SiGe, GaAs, InSb, GaP, GaSb, InAlAs, InGaAs, GaSbP, GaAsSb and InP. In some embodiments, the substrate 10 is a silicon layer of an SOI (silicon-on insulator) substrate. In certain embodiments, the substrate 10 is made of crystalline Si.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate 10. The germanium concentration of the SiGe buffer layers may increase from 30 atomic % for the bottom-most buffer layer to 70 atomic % for the top-most buffer layer.

In some embodiments, the substrate 10 includes at least one metal, metal alloy, and metal nitride/sulfide/oxide/silicide having the formula $MX_a$, where M is a metal and X is N, S, Se, O, Si, and a is from about 0.4 to about 2.5. In some embodiments, the substrate 10 includes titanium, aluminum, cobalt, ruthenium, titanium nitride, tungsten nitride, tantalum nitride, and combinations thereof.

In some embodiments, the substrate 10 includes a dielectric having at least silicon, metal oxide, and metal nitride of the formula $MX_b$, where M is a metal or Si, X is N or O, and b ranges from about 0.4 to about 2.5. In some embodiments, the substrate 10 includes silicon dioxide, silicon nitride, aluminum oxide, hafnium oxide, lanthanum oxide, and combinations thereof.

Figure 13A:
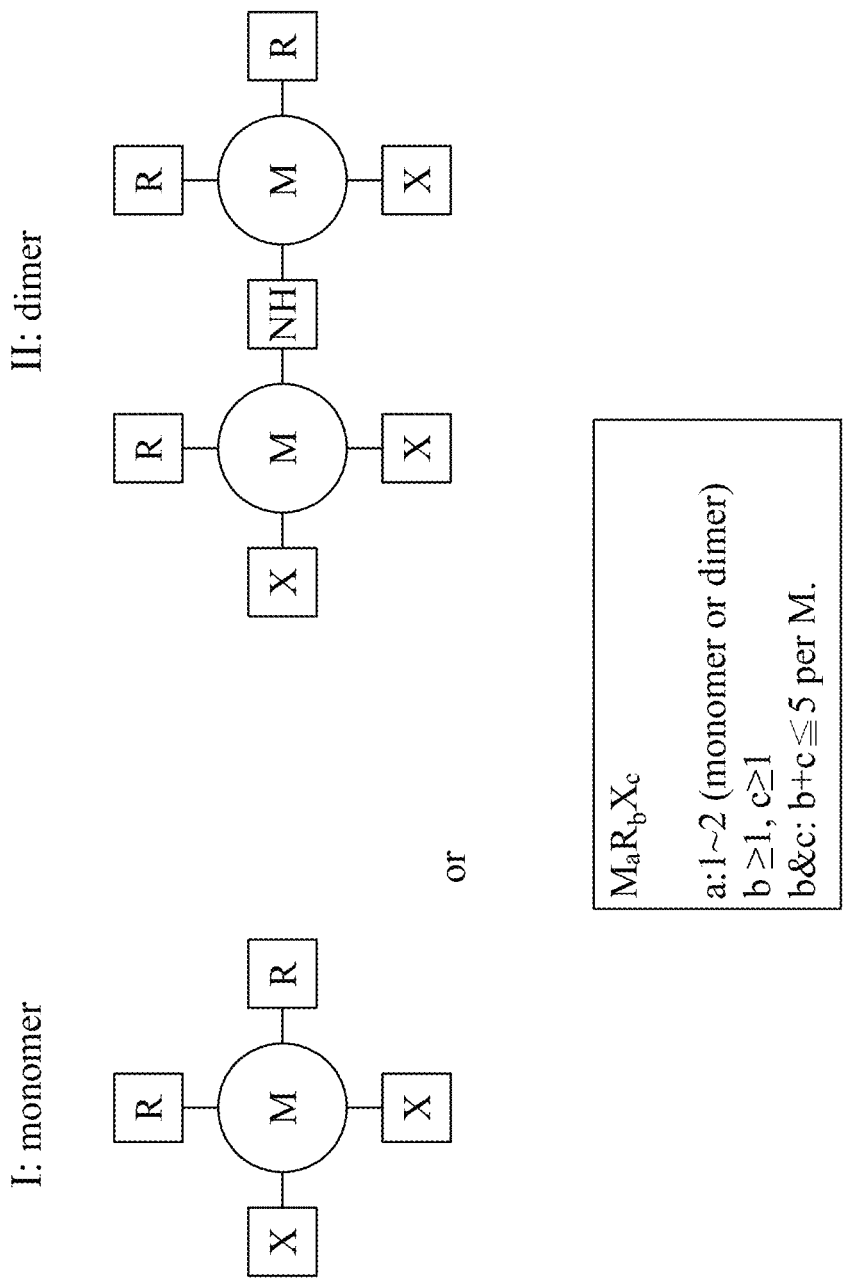
FIG. 13A shows organometallic precursors according to embodiments of the disclosure.

In some embodiments, the first photoresist layer 15a is made of a photoresist composition, including a first compound or a first precursor and a second compound or a second precursor combined in a vapor state. The first precursor or first compound is an organometallic having a formula: $M_aR_bX_c$, as shown in FIG. 13A, where M is at least one of Sn, Bi, Sb, In, Te, Ti, Zr, Hf, V, Co, Mo, W, Al, Ga, Si, Ge, P, As, Y, La, Ce, or Lu; and R is a substituted or unsubstituted alkyl, alkenyl, or carboxylate group. In some embodiments, M is selected from the group consisting of Sn, Bi, Sb, In, Te, and combinations thereof. In some embodiments, R is a C3-C6 alkyl, alkenyl, or carboxylate. In some embodiments, R is selected from the group consisting of propyl, isopropyl, butyl, iso-butyl, sec-butyl, tert-butyl, pentyl, isopentyl, sec-pentyl, tert-pentyl, hexyl, iso-hexyl, sec-hexyl, tert-hexyl, and combinations thereof. X is a ligand, ion, or other moiety, which is reactive with the second compound or second precursor; and $1 \le a \le 2$, $b \ge 1$, $c \ge 1$, and $b+c \le 5$ in some embodiments. In some embodiments, the alkyl, alkenyl, or carboxylate group is substituted with one or more fluoro groups. In some embodiments, the organometallic precursor is a dimer, as shown in FIG. 13A, where each monomer unit is linked by an amine group. Each monomer has a formula: $M_aR_bX_c$, as defined above.

In some embodiments, R is alkyl, such as $C_nH_{2n+1}$ where $n \ge 3$. In some embodiments, R is fluorinated, e.g., having the formula $C_nF_xH_{((2n+1)-x)}$. In some embodiments, R has at least one beta-hydrogen or beta-fluorine. In some embodiments, R is selected from the group consisting of i-propyl, n-propyl, t-butyl, i-butyl, n-butyl, sec-butyl, n-pentyl, i-pentyl, t-pentyl, and sec-pentyl, and combinations thereof.

In some embodiments, X is any moiety readily displaced by the second compound or second precursor to generate an M-OH moiety, such as a moiety selected from the group consisting of amines, including dialkylamino and monoalkylamino; alkoxy; carboxylates, halogens, and sulfonates. In some embodiments, the sulfonate group is substituted with one or more amine groups. In some embodiments, the halide is one or more selected from the group consisting of F, Cl, Br, and I. In some embodiments, the sulfonate group includes a substituted or unsubstituted C1-C3 group.

Figure 13B:
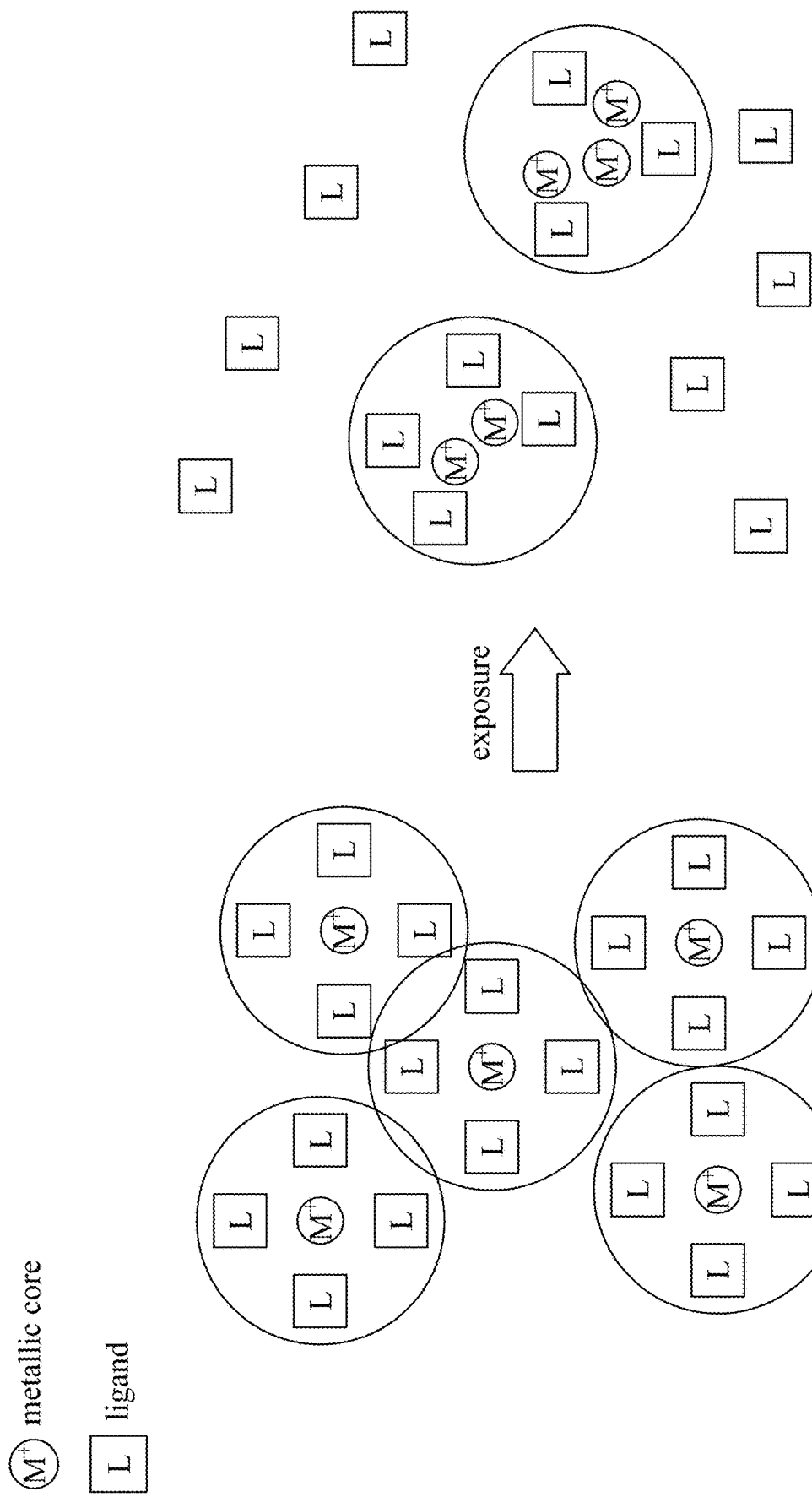
FIG. 13B shows a reaction the organometallic precursors undergo when exposed to actinic radiation.

In some embodiments, the first organometallic compound or first organometallic precursor includes a metallic core $M^+$ with ligands L attached to the metallic core $M^+$, as shown in FIG. 13B. In some embodiments, the metallic core $M^+$ is a metal oxide. The ligands L include C3-C12 aliphatic or aromatic groups in some embodiments. The aliphatic or aromatic groups may be unbranched or branched with cyclic, or noncyclic saturated pendant groups containing 1-9 carbons, including alkyl groups, alkenyl groups, and phenyl groups. The branched groups may be further substituted with oxygen or halogen. In some embodiments, the C3-C12 aliphatic or aromatic groups include heterocyclic groups. In some embodiments, the C3-C12 aliphatic or aromatic groups are attached to the metal by an ether or ester linkage. In some embodiments, the C3-C12 aliphatic or aromatic groups include nitrite and sulfonate substituents.

In some embodiments, the organometallic precursor or organometallic compound include a sec-hexyl tris(dimethylamino) tin, t-hexyl tris(dimethylamino) tin, i-hexyl tris(dimethylamino) tin, n-hexyl tris(dimethylamino) tin, sec-pentyl tris(dimethylamino) tin, t-pentyl tris(dimethylamino) tin, i-pentyl tris(dimethylamino) tin, n-pentyl tris(dimethylamino) tin, sec-butyl tris(dimethylamino) tin, t-butyl tris(dimethylamino) tin, i-butyl tris(dimethylamino) tin, n-butyl tris(dimethylamino) tin, sec-butyl tris(dimethylamino) tin, i-propyl(tris)dimethylamino tin, n-propyl tris(diethylamino) tin, and analogous alkyl(tris)(t-butoxy) tin compounds, including sec-hexyl tris(t-butoxy) tin, t-hexyl tris(t-butoxy) tin, i-hexyl tris(t-butoxy) tin, n-hexyl tris(t-butoxy) tin, sec-pentyl tris(t-butoxy) tin, t-pentyl tris(t-butoxy) tin, i-pentyl tris(t-butoxy) tin, n-pentyl tris(t-butoxy) tin, t-butyl tris(t-butoxy) tin, i-butyl tris(butoxy) tin, n-butyl tris(butoxy) tin, sec-butyl tris(butoxy) tin, i-propyl(tris)dimethylamino tin, or n-propyl tris(butoxy) tin. In some embodiments, the organometallic precursors or organometallic compounds are fluorinated. In some embodiments, the organometallic precursors or compounds have a boiling point less than about 200° C.

In some embodiments, the first compound or first precursor includes one or more unsaturated bonds that can be coordinated with a functional group, such as a hydroxyl group, on the surface of the substrate or an intervening underlayer to improve adhesion of the photoresist layer to the substrate or underlayer.

In some embodiments, the second precursor or second compound is at least one of an amine, a borane, a phosphine, or water. In some embodiments, the amine has a formula $N_pH_nX_m$, where $0 \le n \le 3$, $0 \le m \le 3$, $n+m=3$ when p is 1, and $n+m=4$ when p is 2, and each X is independently a halogen selected from the group consisting of F, Cl, Br, and I. In some embodiments, the borane has a formula $B_pH_nX_m$, where $0 \le n \le 3$, $0 \le m \le 3$, $n+m=3$ when p is 1, and $n+m=4$ when p is 2, and each X is independently a halogen selected from the group consisting of F, Cl, Br, and I. In some embodiments, the phosphine has a formula $P_pH_nX_m$, where $0 \le n \le 3$, $0 \le m \le 3$, $n+m=3$, when p is 1, or $n+m=4$ when p is 2, and each X is independently a halogen selected from the group consisting of F, Cl, Br, and I.

FIG. 13B shows metallic precursors undergoing a reaction as a result of exposure to actinic radiation in some embodiments. As a result of exposure to the actinic radiation, ligand groups L are split off from the metallic core W of the metallic precursors, and two or more metallic precursor cores bond with each other.

Figure 13C:
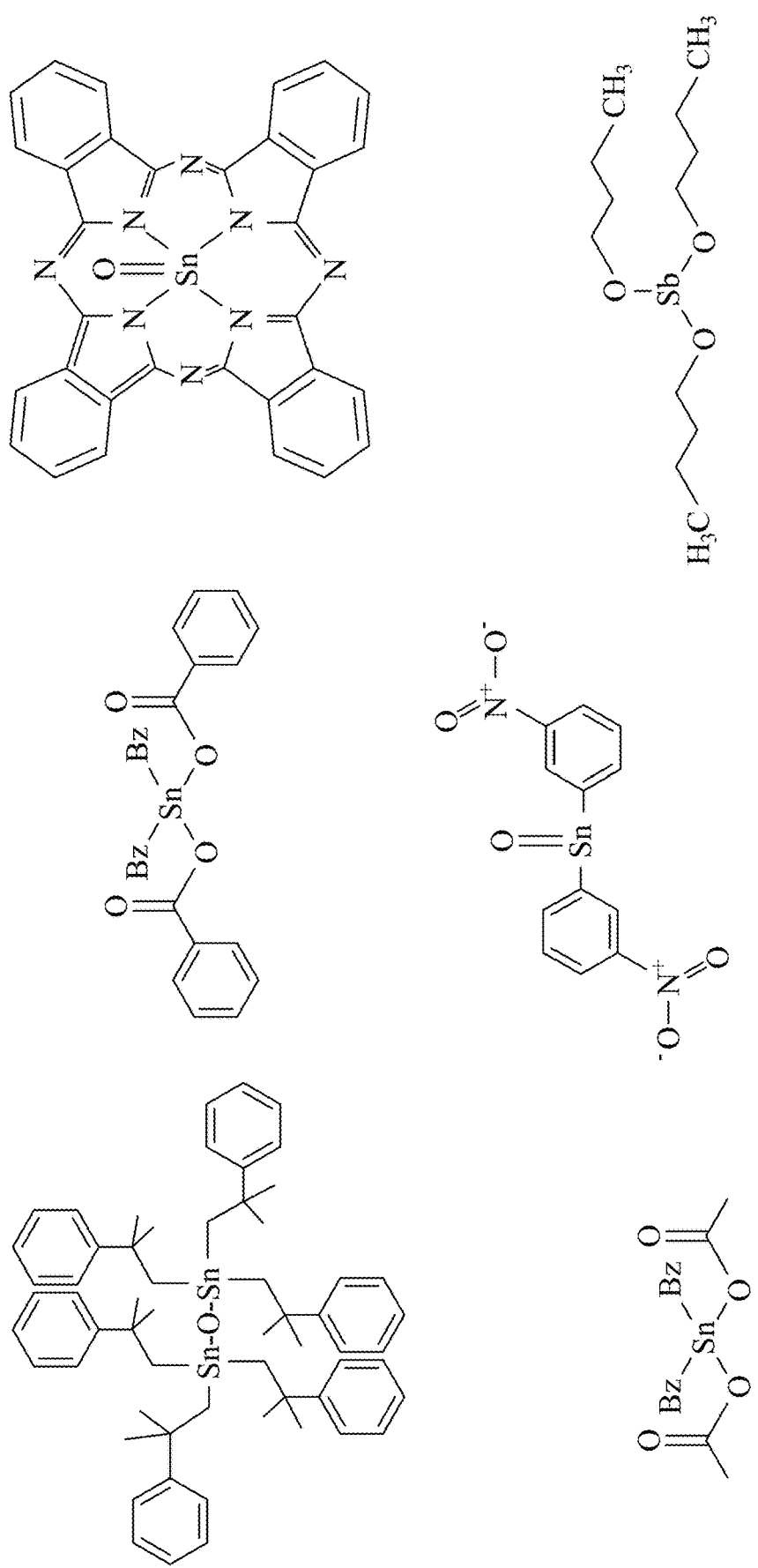
FIG. 13C shows examples of organometallic precursors according to embodiments of the disclosure.

FIG. 13C shows examples of organometallic precursors according to embodiments of the disclosure. In FIG. 13C, Bz is a benzene group.

In some embodiments, the depositing a photoresist composition is performed by a vapor phase deposition operation. In some embodiments, the vapor phase deposition operation includes atomic layer deposition (ALD) or chemical vapor deposition (CVD). In some embodiments, the ALD includes plasma-enhanced atomic layer deposition (PE-ALD), and the CVD includes plasma-enhanced chemical vapor deposition (PE-CVD), metal-organic chemical vapor deposition (MO-CVD); atmospheric pressure chemical vapor deposition (AP-CVD), and low pressure chemical vapor deposition (LP-CVD).

Figure 14:
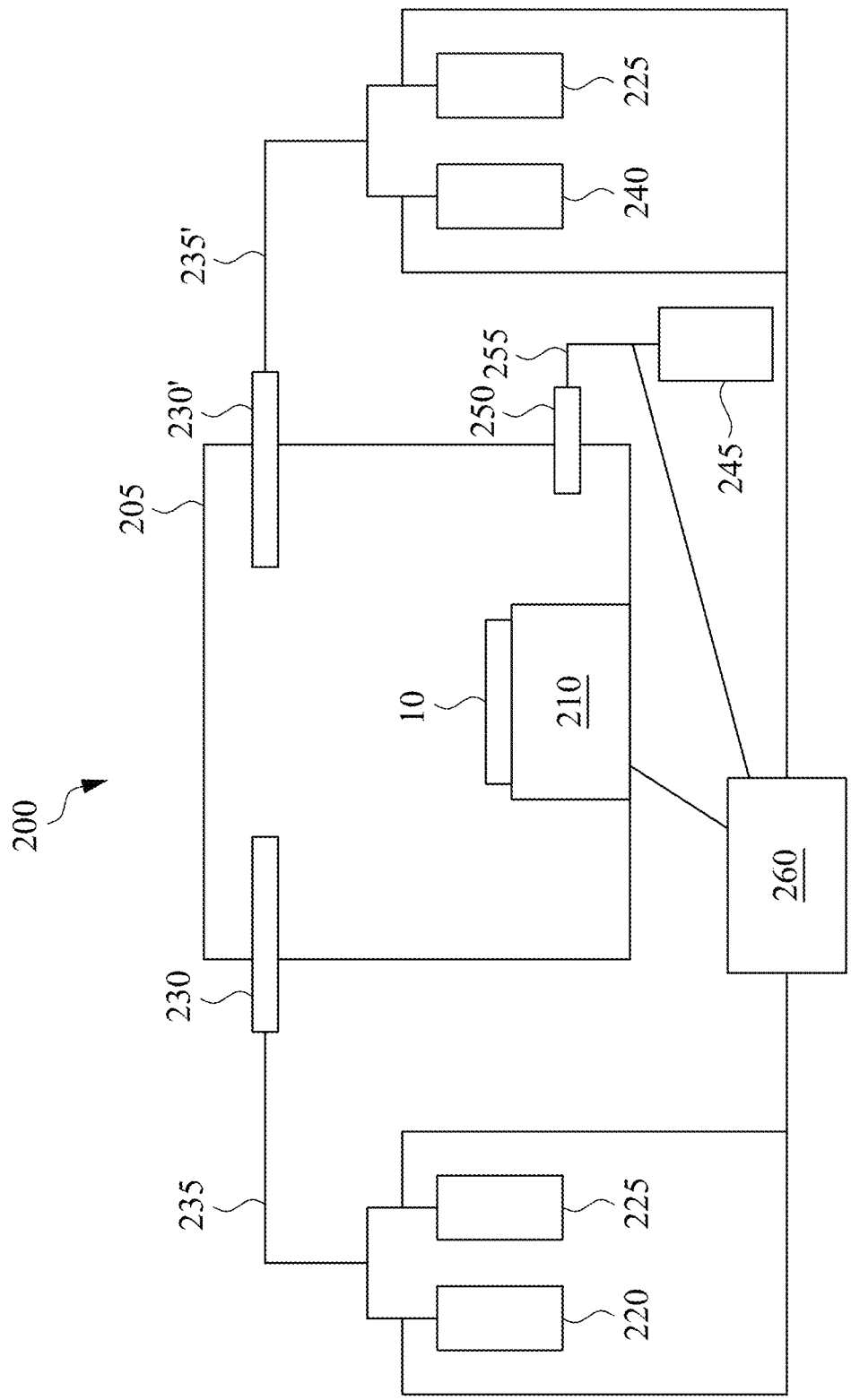
FIG. 14 shows a resist deposition apparatus according to embodiments of the disclosure.

A resist layer deposition apparatus 200 according to some embodiments of the disclosure is shown in FIG. 14. In some embodiments, the deposition apparatus 200 is an ALD or CVD apparatus. The deposition apparatus 200 includes a vacuum chamber 205. A substrate support stage 210 in the vacuum chamber 205 supports a substrate 10, such as silicon wafer. In some embodiments, the substrate support stage 210 includes a heater. A first precursor or compound gas supply 220 and carrier/purge gas supply 225 are connected to an inlet 230 in the chamber via a gas line 235, and a second precursor or compound gas supply 240 and carrier/purge gas supply 225 are connected to another inlet 230' in the chamber via another gas line 235' in some embodiments. The chamber is evacuated, and excess reactants and reaction byproducts are removed by a vacuum pump 245 via an outlet 250 and exhaust line 255. In some embodiments, the flow rate or pulses of precursor gases and carrier/purge gases, evacuation of excess reactants and reaction byproducts, pressure inside the vacuum chamber 205, and temperature of the vacuum chamber 205 or wafer support stage 210 are controlled by a controller 260 configured to control each of these parameters.

Depositing a photoresist layer includes combining the first compound or first precursor and the second compound or second precursor in a vapor state to form the photoresist composition. In some embodiments, the first compound or first precursor and the second compound or second precursor of the photoresist composition are introduced into the deposition chamber 205 (CVD chamber) at about the same time via the inlets 230, 230'. In some embodiments, the first compound or first precursor and second compound or second precursor are introduced into the deposition chamber 205 (ALD chamber) in an alternating manner via the inlets 230, 230', i.e.—first one compound or precursor then a second compound or precursor, and then subsequently alternately repeating the introduction of the one compound or precursor followed by the second compound or precursor.

In some embodiments, the deposition chamber temperature ranges from about 30° C. to about 400° C. during the deposition operation, and between about 50° C. to about 250° C. in other embodiments. In some embodiments, the pressure in the deposition chamber ranges from about 5 mTorr to about 100 Torr during the deposition operation, and between about 100 mTorr to about 10 Torr in other embodiments. In some embodiments, the plasma power is less than about 1000 W. In some embodiments, the plasma power ranges from about 100 W to about 900 W. In some embodiments, the flow rate of the first compound or precursor and the second compound or precursor ranges from about 100 sccm to about 1000 sccm. In some embodiments, the ratio of the flow of the organometallic compound precursor to the second compound or precursor ranges from about 1:1 to about 1:5. At operating parameters outside the above-recited ranges, unsatisfactory photoresist layers result in some embodiments. In some embodiments, the photoresist layer formation occurs in a single chamber (a one-pot layer formation).

In a CVD process according to some embodiments of the disclosure, two or more gas streams, in separate inlet paths 230, 235 and 230', 235', of an organometallic precursor and a second precursor are introduced to the deposition chamber 205 of a CVD apparatus, where they mix and react in the gas phase, to form a reaction product. The streams are introduced using separate injection inlets 230, 230' or a dual-plenum showerhead in some embodiments. The deposition apparatus is configured so that the streams of organometallic precursor and second precursor are mixed in the chamber, allowing the organometallic precursor and second precursor to react to form a reaction product. Without limiting the mechanism, function, or utility of the disclosure, it is believed that the product from the vapor-phase reaction becomes heavier in molecular weight, and is then condensed or otherwise deposited onto the substrate 10.

In some embodiments, an ALD process is used to deposit the photoresist layer. During ALD, a layer is grown on a substrate 10 by exposing the surface of the substrate to alternate gaseous compounds (or precursors). In contrast to CVD, the precursors are introduced as a series of sequential, non-overlapping pulses. In each of these pulses, the precursor molecules react with the surface in a self-limiting way, so that the reaction terminates once all the reactive sites on the surface are consumed. Consequently, the maximum amount of material deposited on the surface after a single exposure to all of the precursors (a so-called ALD cycle) is determined by the nature of the precursor-surface interaction.

In an embodiment of an ALD process, an organometallic precursor is pulsed to deliver the metal-containing precursor to the substrate 10 surface in a first half reaction. In some embodiments, the organometallic precursor reacts with a suitable underlying species (for example OH or NH functionality on the surface of the substrate) to form a new self-saturating surface. Excess unused reactants and the reaction by-products are removed, by an evacuation-pump down using a vacuum pump 245 and/or by a flowing an inert purge gas in some embodiments. Then, a second precursor, such as ammonia ($NH_3$), is pulsed to the deposition chamber in some embodiments. The $NH_3$ reacts with the organometallic precursor on the substrate to obtain a reaction product photoresist on the substrate surface. The second precursor also forms self-saturating bonds with the underlying reactive species to provide another self-limiting and saturating second half reaction. A second purge is performed to remove unused reactants and the reaction by-products in some embodiments. Pulses of the first precursor and second precursor are alternated with intervening purge operations until a desired thickness of the photoresist layer is achieved.

In some embodiments, the first and second compounds or precursors are delivered into the deposition chamber 205 with a carrier gas. The carrier gas, a purge gas, a deposition gas, or other process gas may contain nitrogen, hydrogen, argon, neon, helium, or combinations thereof.

In some embodiments, the organometallic compound includes tin (Sn), antimony (Sb), bismuth (Bi), indium (In), and/or tellurium (Te) as the metal component, however, the disclosure is not limited to these metals. In other embodiments, additional suitable metals include titanium (Ti), zirconium (Zr), hafnium (Hf), vanadium (V), cobalt (Co), molybdenum (Mo), tungsten (W), aluminum (Al), gallium (Ga), silicon (Si), germanium (Ge), phosphorus (P), arsenic (As), yttrium (Y), lanthanum (La), cerium (Ce), lutetium (Lu), or combinations thereof. The additional metals can be as alternatives to or in addition to the Sn, Sb, Bi, In, and/or Te.

The particular metal used may significantly influence the absorption of radiation. Therefore, the metal component can be selected based on the desired radiation and absorption cross section. Tin, antimony, bismuth, tellurium, and indium provide strong absorption of extreme ultraviolet light at 13.5 nm. Hafnium provides good absorption of electron beam and extreme UV radiation. Metal compositions including titanium, vanadium, molybdenum, or tungsten have strong absorption at longer wavelengths, to provide, for example, sensitivity to 248 nm wavelength ultraviolet light.

Figure 15:
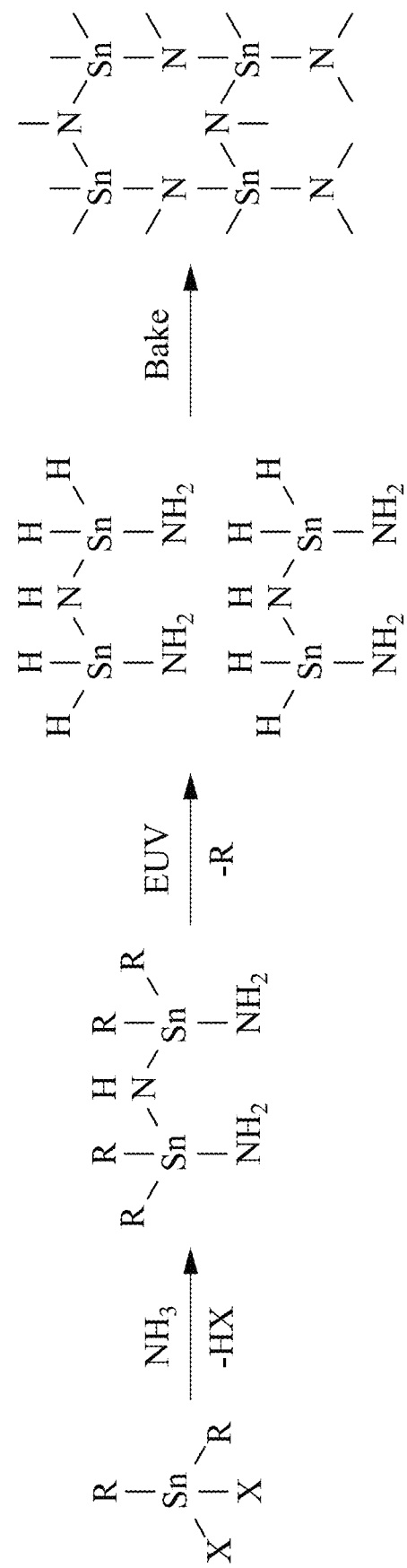
FIG. 15 shows a reaction the photoresist composition components undergo as a result of exposure to actinic radiation and heating according to an embodiment of the disclosure.

FIG. 15 shows a reaction the photoresist composition components undergo as a result of exposure to actinic radiation and heating according to an embodiment of the disclosure. FIG. 15 shows an exemplary chemical structure of the photoresist layer at various stages of the photoresist patterning method according to embodiments of the disclosure. As shown in FIG. 16, the photoresist composition includes an organometallic compound, for example $SnX_2R_2$, and a second compound, for example ammonia ($NH_3$). When the organometallic compound and the ammonia are combined, the organometallic compound reacts with some of the ammonia in the vapor phase to form a reaction product with amine groups attached to the metal (Sn) of the organometallic compound. The amine groups in the as deposited photoresist layer have hydrogen bonds that can substantially increase the boiling point of the deposited photoresist layer and help prevent the outgassing of metal-containing photoresist material. Moreover, the hydrogen bonds of the amine groups can help control the effect moisture has on photoresist layer quality.

When subsequently exposed to extreme ultraviolet radiation, the organometallic compound absorbs the extreme ultraviolet radiation and one or more organic R groups are cleaved from the organometallic compound to form an amino metallic compound in the radiation exposed areas. Then, when the post-exposure bake (PEB) performed, the amino metallic compounds crosslink through the amine groups in some embodiments, as shown in FIG. 15. In some embodiments, partial crosslinking of the amino metallic compounds occurs as a result of the exposure to extreme ultraviolet radiation.

Photoresists used in the first photoresist layer 15a according to the present disclosure include a polymer along with one or more photoactive compounds (PACs) in a solvent, in some embodiments. In some embodiments, the polymer includes a hydrocarbon structure (such as an alicyclic hydrocarbon structure) that contains one or more groups that will decompose (e.g., acid labile groups) or otherwise react when mixed with acids, bases, or free radicals generated by the PACs (as further described below). In some embodiments, the hydrocarbon structure includes a repeating unit that forms a skeletal backbone of the polymer. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

In some embodiments, the photoresist includes a polymer having acid labile groups selected from the following:

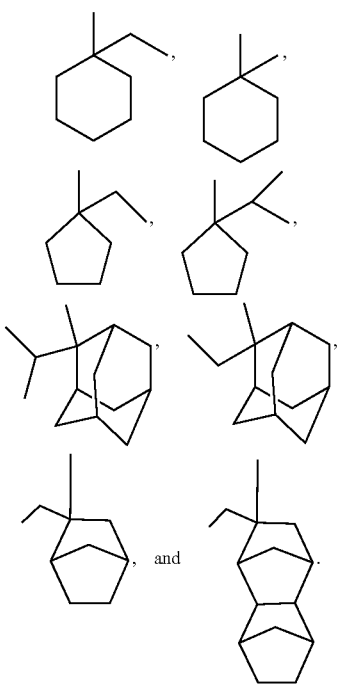

Specific structures that are utilized for the repeating unit of the hydrocarbon structure in some embodiments, include one or more of methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl (meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy) ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate, or the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether, or the like. Examples of styrenes include styrene, methyl styrene, dimethyl styrene, trimethyl styrene, ethyl styrene, isopropyl styrene, butyl styrene, methoxy styrene, butoxy styrene, acetoxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In some embodiments, the repeating unit of the hydrocarbon structure also has either a monocyclic or a polycyclic hydrocarbon structure substituted into it, or the monocyclic or polycyclic hydrocarbon structure is the repeating unit, in order to form an alicyclic hydrocarbon structure. Specific examples of monocyclic structures in some embodiments include bicycloalkane, tricycloalkane, tetracycloalkane, cyclopentane, cyclohexane, or the like. Specific examples of polycyclic structures in some embodiments include adamantane, norbornane, isobornane, tricyclodecane, tetracyclododecane, or the like.

The group which will decomposes attached to the hydrocarbon structure so that it will react with the acids/bases/free radicals generated by the PACs during exposure. Groups that react with acids are known as acid labile groups. In some embodiments, the group which will decompose is a carboxylic acid group, a fluorinated alcohol group, a phenolic alcohol group, a sulfonic group, a sulfonamide group, a sulfonylimido group, an (alkylsulfonyl) (alkylcarbonyl)methylene group, an (alkyl sulfonyl)(alkyl-carbonyl)imido group, a bis(alkylcarbonyl)methylene group, a bis(alkylcarbonyl)imido group, a bis(alkylsylfonyl)methylene group, a bis(alkylsulfonyl)imido group, a tris(alkylcarbonyl methylene group, a tris(alkylsulfonyl)methylene group, combinations of these, or the like. Specific groups that are used for the fluorinated alcohol group include fluorinated hydroxyalkyl groups, such as a hexafluoroisopropanol group in some embodiments. Specific groups that are used for the carboxylic acid group include acrylic acid groups, methacrylic acid groups, or the like.

In some embodiment, the acid labile group (ALG) decomposes by the action of the acid generated by the photoacid generator leaving a carboxylic acid group pendant to the polymer resin chain, as shown in the ALG de-protect reaction:

ALG de-protect reaction

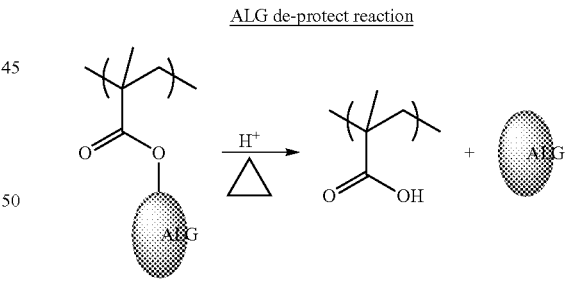

In some embodiments, the polymer also includes other groups attached to the hydrocarbon structure that help to improve a variety of properties of the polymerizable resin. For example, inclusion of a lactone group to the hydrocarbon structure assists to reduce the amount of line edge roughness after the photoresist has been developed, thereby helping to reduce the number of defects that occur during development. In some embodiments, the lactone groups include rings having five to seven members, although any suitable lactone structure may alternatively be used for the lactone group.

In some embodiments, the polymer includes groups that can assist in increasing the adhesiveness of the photoresist layer 15 to underlying structures (e.g., substrate 10). Polar groups may be used to help increase the adhesiveness. Suitable polar groups include hydroxyl groups, cyano groups, or the like, although any suitable polar group may, alternatively, be used.

Optionally, the polymer includes one or more alicyclic hydrocarbon structures that do not also contain a group which will decompose in some embodiments. In some embodiments, the hydrocarbon structure that does not contain a group which will decompose includes structures such as 1-adamantyl(meth)acrylate, tricyclodecanyl (meth)acrylate, cyclohexyl (methacrylate), combinations of these, or the like. In some embodiments, the photoresist composition includes one or more photoactive compounds (PAC).

In some embodiments, the PACs include photoacid generators, photobase generators, photo decomposable bases, free-radical generators, or the like. In some embodiments in which the PACs are photoacid generators, the PACs include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy di carboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, combinations of these, or the like.

Specific examples of photoacid generators include α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl)sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like.

In some embodiments in which the PACs are free-radical generators, the PACs include n-phenylglycine; aromatic ketones, including benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone; anthraquinone, 2-ethylanthraquinone; naphthaquinone; and phenanthraquinone; benzoins including benzoin, benzoinmethylether, benzoinisopropylether, benzoin-n-butylether, benzoin-phenylether, methylbenzoin and ethylbenzoin; benzyl derivatives, including dibenzyl, benzyldiphenyldisulfide, and benzyldimethylketal; acridine derivatives, including 9-phenylacridine, and 1,7-bis(9-acridinyl)heptane; thioxanthones, including 2-chlorothioxanthone, 2-methylthioxanthone, 2,4-diethylthioxanthone, 2,4-dimethylthioxanthone, and 2-isopropylthioxanthone; acetophenones, including 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone; 2,4,5-triarylimidazole dimers, including 2-(o-chlorophenyl)-4,5-diphenylimidazole dimer, 2-(o-chlorophenyl)-4,5-di-(m-methoxyphenyl) imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer; combinations of these, or the like.

In some embodiments, the solvent is an organic solvent, and includes one or more of any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

The photoresist compositions may also include a number of other additives that assist the photoresist to obtain high resolution. For example, some embodiments of the photoresist also includes surfactants in order to help improve the ability of the photoresist to coat the surface on which it is applied. Another additive added to some embodiments of the photoresist composition is a quencher, which inhibits diffusion of the generated acids/bases/free radicals within the photoresist. The quencher improves the resist pattern configuration as well as the stability of the photoresist over time. Other additive added to some embodiments of the photoresist is a stabilizer, which assists in preventing undesired diffusion of the acids generated during exposure of the photoresist; a dissolution inhibitor to help control dissolution of the photoresist during development; a plasticizer, to reduce delamination and cracking between the photoresist and underlying layers (e.g., the layer to be patterned); and an adhesion promoter.

In some embodiments, the developer 57 is applied to the photoresist layers using a spin-on process. In the spin-on process, the developer 57 is applied to the photoresist layer 15 from above the photoresist layer 15 while the photoresist coated substrate is rotated, as shown in FIG. 4. In some embodiments, the developer 57 is supplied at a rate of between about 5 ml/min and about 800 ml/min, while the photoresist coated substrate 10 is rotated at a speed of between about 100 rpm and about 2000 rpm. In some embodiments, the developer is at a temperature of between about 20° C. and about 75° C. during the development operation. The development operation continues for between about 10 seconds to about 10 minutes in some embodiments.

While the spin-on operation is one suitable method for developing the photoresist layer 15a after exposure, it is intended to be illustrative and is not intended to limit the embodiment. Rather, any suitable development operations, including dip processes, puddle processes, and spray-on methods, may alternatively be used. All such development operations are included within the scope of the embodiments.

Development is performed using a solvent. In some embodiments where positive tone development is desired, a positive tone developer such as a basic aqueous solution is used. In some embodiments, the positive tone developer includes one or more selected from tetramethylammonium hydroxide (TMAH), tetrabutylammonium hydroxide, sodium hydroxide, potassium hydroxide, sodium carbonate, sodium bicarbonate, sodium silicate, sodium metasilicate, aqueous ammonia, monomethylamine, dimethylamine, trimethylamine, monoethylamine, diethylamine, triethylamine, monoisopropylamine, diisopropylamine, triisopropylamine, monobutylamine, dibutylamine, monoethanolamine, diethanolamine, triethanolamine, dimethylaminoethanol, diethylaminoethanol, ammonia, caustic soda, caustic potash, sodium metasilicate, potassium metasilicate, sodium carbonate, tetraethylammonium hydroxide, combinations of these, or the like.

In some embodiments where negative tone development is desired, an organic solvent or critical fluid is used to remove the unexposed regions of the photoresist. In some embodiments, the negative tone developer includes one or more selected from hexane, heptane, octane, toluene, xylene, dichloromethane, chloroform, carbon tetrachloride, trichloroethylene, and like hydrocarbon solvents; critical carbon dioxide, methanol, ethanol, propanol, butanol, and like alcohol solvents; diethyl ether, dipropyl ether, dibutyl ether, ethyl vinyl ether, dioxane, propylene oxide, tetrahydrofuran, cellosolve, methyl cellosolve, butyl cellosolve, methyl carbitol, diethylene glycol monoethyl ether and like ether solvents; acetone, methyl ethyl ketone, methyl isobutyl ketone, isophorone, cyclohexanone and like ketone solvents; methyl acetate, ethyl acetate, propyl acetate, butyl acetate and like ester solvents; pyridine, formamide, and N,N-dimethyl formamide or the like.

After developing, remaining developer is removed from the patterned photoresist covered substrate. The remaining developer is removed using a spin-dry process in some embodiments, although any suitable removal technique may be used.

Other embodiments include other operations before, during, or after the operations described above. In some embodiments, the disclosed methods include forming fin field effect transistor (FinFET) structures. In some embodiments, a plurality of active fins are formed on the semiconductor substrate. Such embodiments, further include etching the substrate through the openings of a patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In some embodiments, one or more gate electrodes are formed on the substrate. Some embodiments include forming gate spacers, doped source/drain regions, contacts for gate/source/drain features, etc. In other embodiments, a target pattern is formed as metal lines in a multilayer interconnection structure. For example, the metal lines may be formed in an inter-layer dielectric (ILD) layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer. The above are non-limiting examples of devices/structures that can be made and/or improved using the method described herein.

In some embodiments, active components such as diodes, field-effect transistors (FETs), metal-oxide semiconductor field effect transistors (MOSFET), complementary metal-oxide semiconductor (CMOS) transistors, bipolar transistors, high voltage transistors, high frequency transistors, FinFETs, other three-dimensional (3D) FETs, other memory cells, and combinations thereof are formed.

Serious scum defect and line width roughness issues of line/space patterning are an issue of metal-oxide resist lithography patterning. These defects and issues are a serious challenge in photolithography. Embodiments of the present disclosure provide improved pattern line/spaces and improved line width roughness and improved line edge roughness. Embodiments of the present disclosure reduce defects caused by photoresist bottom scum. Embodiments of the disclosure allow the use of reduced exposure dose (EOP). Embodiments of the disclosure provide photoresist tone reversal.

An embodiment of the disclosure is a method of manufacturing a semiconductor device, including forming a first resist layer over a substrate, and forming a second resist layer over the first resist layer. The second resist layer is patterned to expose a portion of the first resist layer to form a second resist layer pattern. The first resist layer is exposed to extreme ultraviolet (XUV) radiation diffracted by the second resist layer pattern. Portions of the first resist layer exposed to the XUV radiation diffracted by the second resist layer are removed. In an embodiment, the exposing the first resist layer to diffracted XUV radiation includes a directional exposure. In an embodiment, the second resist layer is a made of a negative tone resist. In an embodiment, the diffracted XUV radiation has a wavelength ranging from 0.1 nm to 100 nm. In an embodiment, the diffracted XUV radiation has a wavelength ranging from 10 nm to 30 nm. In an embodiment, the first resist layer is a chemically amplified resist. In an embodiment, the second resist layer is a metal-containing resist. In an embodiment, the second resist layer comprises an organometallic compound. In an embodiment, the second resist layer comprises a tin oxide.

Another embodiment of the disclosure is a method of manufacturing a semiconductor device, including forming a first photoresist layer over a substrate and forming a second photoresist layer over the first photoresist layer. The second photoresist layer is different from the first photoresist layer. The second photoresist layer is selectively exposed to actinic radiation to form a latent image in the second photoresist layer. The second photoresist layer is developed to form a pattern in the second photoresist layer exposing a portion of the first photoresist layer. Remaining portions of the second photoresist layer and the first photoresist layer are flood exposed to an exposure radiation having a wavelength ranging from 0.1 nm to 100 nm. The remaining portions of the second photoresist layer diffract the exposure radiation. The first photoresist layer is developed to expose portions of the substrate. In an embodiment, the flood exposing is a directional exposure. In an embodiment, the first photoresist layer is made of a positive tone resist and the second photoresist layer is a made of a negative tone resist. In an embodiment, the first photoresist layer is a chemically amplified resist. In an embodiment, the second photoresist layer is a metal-containing resist. In an embodiment, the remaining second photoresist layer is removed during the developing the first photoresist layer.

Another embodiment of the disclosure is a method of manufacturing a semiconductor device, including forming a target layer over a substrate. A chemically amplified photoresist layer is formed over the target layer. A metallic photoresist layer is formed over the chemically amplified photoresist layer. The metallic photoresist layer is selectively exposed to actinic radiation. Portions of the metallic photoresist layer that were not exposed to the actinic radiation are removed to form a patterned metallic photoresist layer. The patterned metallic photoresist layer and the chemically amplified photoresist layer are flood exposed to extreme ultraviolet (XUV) radiation; and portions of the chemically amplified photoresist layer not covered by the patterned metallic photoresist layer and the patterned metallic photoresist layer are removed to form a patterned chemically amplified photoresist layer exposing portions of the target layer. In an embodiment, the method includes removing exposed portions of the target layer. In an embodiment, the target layer is a silicon-containing hard mask layer. In an embodiment, the flood exposing is a directional exposure of XUV radiation. In an embodiment, the XUV radiation has a wavelength ranging from 10 nm to 30 nm.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a first resist layer over a substrate;
    forming a second resist layer over the first resist layer, wherein the second resist layer is a metal-containing resist;
    patterning the second resist layer to expose a portion of the first resist layer to form a second resist layer pattern, wherein the patterning includes exposing the second resist layer to a scanning electron beam;
    exposing the first resist layer to extreme ultraviolet (XUV) radiation diffracted by the second resist layer pattern; and
    removing portions of the first resist layer exposed to the XUV radiation diffracted by the second resist layer.

2. The method according to claim 1, wherein the exposing the first resist layer to diffracted XUV radiation includes a directional exposure.

3. The method according to claim 1, wherein the second resist layer is made of a negative tone resist.

4. The method according to claim 1, wherein the diffracted XUV radiation has a wavelength ranging from 0.1 nm to 100 nm.

5. The method according to claim 4, wherein the diffracted XUV radiation has a wavelength ranging from 10 nm to 30 nm.

6. The method according to claim 1, wherein the first resist layer is a chemically amplified resist.

7. The method according to claim 1, wherein the second resist layer is formed directly on the first resist layer.

8. The method according to claim 1, wherein the second resist layer comprises an organometallic compound.

9. The method according to claim 1, wherein the second resist layer comprises a tin oxide.

10. A method of manufacturing a semiconductor device, comprising,
    forming a first photoresist layer over a substrate;
    forming a second photoresist layer over the first photoresist layer,
    wherein the second photoresist layer is different from the first photoresist layer, and the second photoresist layer is a metal-containing resist;
    selectively exposing the second photoresist layer to a scanning electron beam to form a latent image in the second photoresist layer;
    developing the second photoresist layer to form a pattern in the second photoresist layer exposing a portion of the first photoresist layer;
    flood exposing remaining portions of the second photoresist layer and the first photoresist layer to an exposure radiation having a wavelength ranging from 0.1 nm to 100 nm,
    wherein the remaining portions of the second photoresist layer diffract the exposure radiation; and
    developing the first photoresist layer to expose portions of the substrate.

11. The method according to claim 10, wherein the flood exposing is a directional exposure.

12. The method according to claim 10, wherein the first photoresist layer is made of a positive tone resist and the second photoresist layer is a made of a negative tone resist.

13. The method according to claim 10, wherein the first photoresist layer is a chemically amplified resist.

14. The method according to claim 10, wherein the second resist layer is formed directly on the first resist layer.

15. The method according to claim 10, wherein the remaining second photoresist layer is removed during the developing the first photoresist layer.

16. A method of manufacturing a semiconductor device, comprising:
    forming a first resist layer over a substrate;
    forming a second resist layer over the first resist layer, wherein the second resist layer is a metal-containing resist;
    exposing the second resist layer to a scanning electron beam;
    developing the second resist layer to form a second resist layer pattern in the second resist layer exposing a portion of the first resist layer;
    exposing the first resist layer to extreme ultraviolet (XUV) radiation diffracted by the second resist layer pattern; and
    removing portions of the first resist layer exposed to the XUV radiation diffracted by the second resist layer.

17. The method according to claim 16, wherein the exposing the first resist layer to diffracted XUV radiation includes a directional exposure.

18. The method according to claim 16, wherein the second resist layer is a made of a negative tone resist.

19. The method according to claim 16, wherein the diffracted XUV radiation has a wavelength ranging from 0.1 nm to 100 nm.

20. The method according to claim 19, wherein the diffracted XUV radiation has a wavelength ranging from 10 nm to 30 nm.

* * * * *